(12) United States Patent
Matamis et al.

(10) Patent No.: US 7,582,529 B2
(45) Date of Patent: Sep. 1, 2009

(54) METHODS OF FABRICATING NON-VOLATILE MEMORY WITH INTEGRATED PERIPHERAL CIRCUITRY AND PRE-ISOLATION MEMORY CELL FORMATION

(75) Inventors: George Matamis, San Jose, CA (US); Takashi Orimoto, Sunnyvale, CA (US); Masaaki Higashitani, Cupertino, CA (US); James Kai, Santa Clara, CA (US); Tuan Pham, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/061,641

(22) Filed: Apr. 2, 2008

(65) Prior Publication Data
US 2008/0248622 A1    Oct. 9, 2008

Related U.S. Application Data

(60) Provisional application No. 60/909,713, filed on Apr. 2, 2007.

(51) Int. Cl.
*H01L 21/8247* (2006.01)
(52) U.S. Cl. .............................. 438/258; 257/E21.179; 438/594
(58) Field of Classification Search ......... 438/257–267, 438/593–594
See application file for complete search history.

(56) References Cited

U.S. PATENT DOCUMENTS

| | | | |
|---|---|---|---|
| 5,459,091 A | 10/1995 | Hwang | |
| 5,668,034 A | 9/1997 | Sery et al. | |
| 5,861,347 A | 1/1999 | Maiti et al. | |
| 6,040,220 A | 3/2000 | Gardner et al. | |
| 6,066,534 A | 5/2000 | Son | |
| 6,204,159 B1 | 3/2001 | Chang et al. | |
| 6,746,920 B1 | 6/2004 | Wen et al. | |
| 6,888,755 B2 | 5/2005 | Harari | |

(Continued)

OTHER PUBLICATIONS

Chan, et al., "A True Single Transistor Oxide-Nitride-Oxide EEPROM Device," IEEE Electron Device Letters, vol. EDL-8, No. 3, Mar. 1987, pp. 93-95.

(Continued)

*Primary Examiner*—Richard A. Booth
(74) *Attorney, Agent, or Firm*—Vierra Magen Marcus & DeNiro LLP

(57) ABSTRACT

Non-volatile semiconductor memory devices with dual control gate memory cells and methods of forming the same using integrated peripheral circuitry formation are provided. Strips of charge storage material elongated in a row direction across the surface of a substrate with strips of tunnel dielectric material therebetween are formed. Forming the strips defines the dimension of the resulting charge storage structures in the column direction. The strips of charge storage material can include multiple layers of charge storage material to form composite charge storage structures in one embodiment. Strips of control gate material are formed between strips of charge storage material adjacent in the column direction. The strips of charge storage and control gate material are divided along their lengths in the row direction as part of forming isolation trenches and columns of active areas. After dividing the strips, the charge storage material at the peripheral circuitry region of the substrate is etched to define a gate dimension in the column direction for a peripheral transistor. Control gate interconnects can be formed to connect together rows of isolated control gates to extrinsically form word lines.

2 Claims, 18 Drawing Sheets

U.S. PATENT DOCUMENTS

| | | |
|---|---|---|
| 7,026,684 B2 | 4/2006 | Sakuma et al. |
| 2002/0146883 A1 | 10/2002 | Furuhata |
| 2005/0207225 A1 | 9/2005 | Chen et al. |
| 2006/0286749 A1 | 12/2006 | Tseng et al. |
| 2007/0128787 A1 | 6/2007 | Higashitani |
| 2007/0243680 A1 | 10/2007 | Harari et al. |

OTHER PUBLICATIONS

Nozaki, et al., "A 1-MbEEPROM with MONOS Memory Cell for Semiconductor Disk Application," Journal of Solid State Circuits, vol. 26, No. 4, Apr. 1991 IEEE, pp. 497-501.

Choi, Yang-Kyu, et al., "Sublithographic nanofabrication technology for nanocatalysts and DNA chips," J.Vac Sci. Technol. B 21(6), American Vacuum Society, Nov./Dec. 2003, pp. 2951-2955.

U.S. Appl. No. 11/623,314, filed Jan. 15, 2007.
U.S. Appl. No. 11/623,315, filed Jan. 15, 2007.
U.S. Appl. No. 11/765,866, filed Jun. 20, 2007.
U.S. Appl. No. 12/014,689, filed Jan. 15, 2008.
U.S. Appl. No. 12/061,642, filed Apr. 2, 2008.
U.S. Appl. No. 12/058,512, filed Mar. 28, 2008.
Invitation To Pay Additional Fees, Patent Cooperation Treaty, PCT Application No. PCT/US2008/059035 filed on Apr. 1, 2008, Jul. 16, 2008.

(y-direction)

(x-direction)

(x-direction)

METHODS OF FABRICATING NON-VOLATILE MEMORY WITH INTEGRATED PERIPHERAL CIRCUITRY AND PRE-ISOLATION MEMORY CELL FORMATION

PRIORITY INFORMATION

The present application claims priority from U.S. Provisional Patent Application No. 60/909,713, entitled "NON-VOLATILE MEMORY FABRICATION," by Kai et al., filed Apr. 2, 2007, incorporated by reference herein in its entirety.

BACKGROUND OF THE INVENTION

1. Field of the Invention

Embodiments of the present disclosure are directed to high density semiconductor devices, such as non-volatile memory, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes. U.S. Pat. No. 6,888,755, entitled "Flash Memory Cell Arrays Having Dual Control Gates Per Memory Cell Charge Storage Element," by Eliyahou Harari, incorporated herein by reference, describes a memory array with a dual control gate structure. U.S. Pat. No. 7,026,684, entitled "Nonvolatile Semiconductor Memory Device," by Sakuma, et al., incorporated herein by reference, describes a memory with an inverted-T type floating gate structure. The charge storage element is divided into two regions having different dimensions.

Fabricating non-volatile memories with more advanced charge storage and control gate structures presents unique requirements for the employed fabrication technologies. Many conventional techniques prove insufficient when working at the reduced feature sizes these memories utilize. More advanced technologies have evolved to meet some of the demands, such as spacer-assisted patterning. Nevertheless, problems still arise. Moreover, these advanced technologies include their own side effects on the fabrication processes that have to be addressed. For example, advanced patterning technologies used to form reduced feature sizes for the cell regions may not be compatible with existing processes that incorporate the formation of other devices at other regions of the substrate.

SUMMARY OF THE INVENTION

High density semiconductor devices and methods of fabricating the same are provided in accordance with one or more embodiments.

Non-volatile semiconductor memory devices with dual control gate memory cells and methods of forming the same using integrated peripheral circuitry formation are provided. Strips of charge storage material elongated in a row direction across the surface of a substrate with strips of tunnel dielectric material therebetween are formed. Forming the strips defines the dimension of the resulting charge storage structures in the column direction. The strips of charge storage material can include multiple layers of charge storage material to form composite charge storage structures in one embodiment. Strips of control gate material are formed between strips of charge storage material adjacent in the column direction. The strips of charge storage and control gate material are divided along their lengths in the row direction as part of forming isolation trenches and columns of active areas. After dividing the strips, the charge storage material at the peripheral circuitry region of the substrate is etched to define a gate dimension in the column direction for a peripheral transistor. Control gate interconnects can be formed to connect together rows of isolated control gates to extrinsically form word lines.

A method of making a non-volatile memory according to one embodiment includes forming a first layer of charge storage material at a peripheral circuitry region of a substrate and a memory array region of the substrate; forming a second layer of charge storage material at the peripheral circuitry region and the memory array region; etching the first layer at the array region to form a first set of strips of charge storage material elongated in a first direction with spaces therebetween in a second direction substantially perpendicular to the first direction, etching the second layer at the array region to form a second set of strips of charge storage material elongated in the first direction with spaces therebetween in the second direction, forming a third set of strips of conductive material elongated in the first direction and at least partially occupying the spaces between adjacent strips of the second layer of charge storage material, etching the first set of strips, the second set of strips and the third set of strips along their lengths in the first direction thereby forming a set of first charge storage regions from each strip of the first set, a set of second charge storage regions from each strip of the second set and a set of control gates from each strip of the third set, and etching the first layer of charge storage material and the second layer of charge storage material at the peripheral circuitry region to define a dimension of a gate region for a transistor after etching the sets of strips at the memory array region.

Other features, aspects, and objects of the disclosed technology can be obtained from a review of the specification, the figures, and the claims.

DETAILED DESCRIPTION

Figure 1:
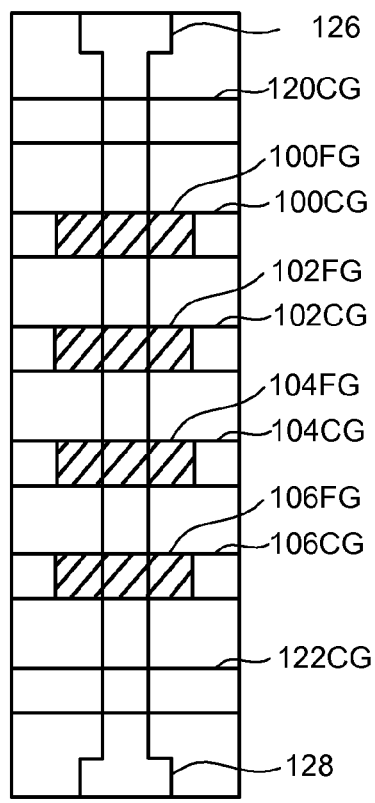
FIG. 1 is a top view of a NAND string.
Figure 2:
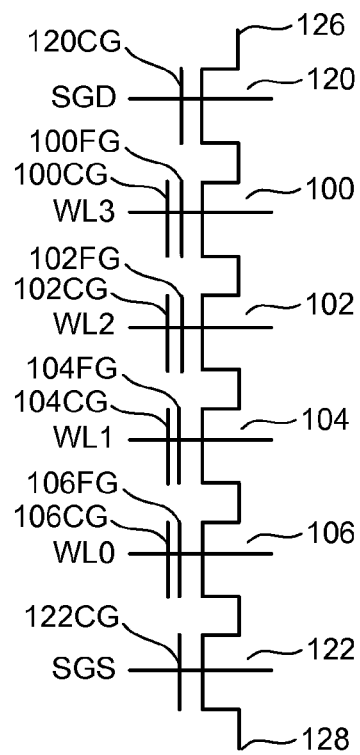
FIG. 2 is an equivalent circuit diagram of the NAND string depicted in FIG. 1.
Figure 3:
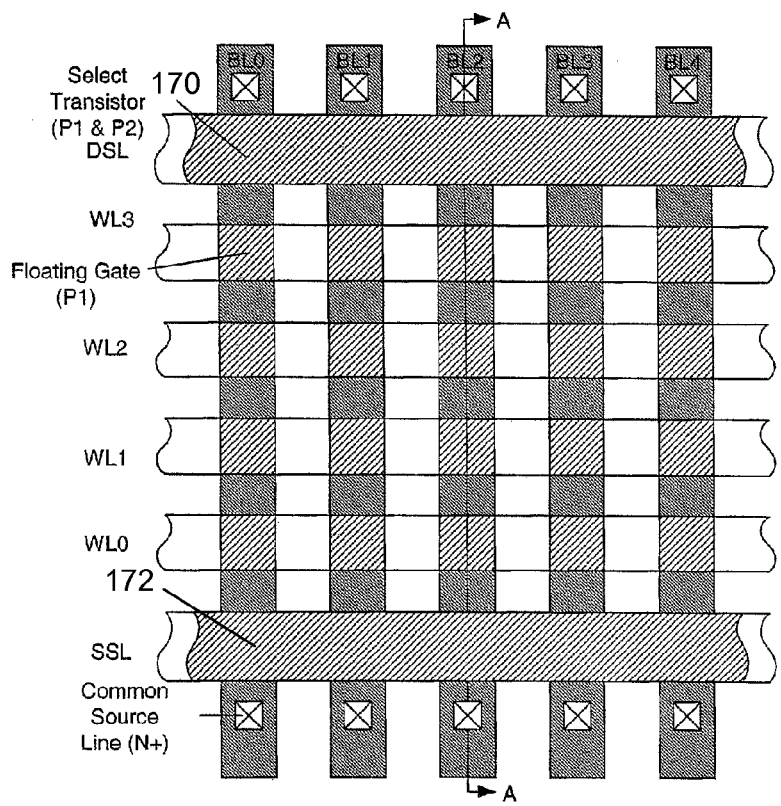
FIG. 3 is a plan view of a portion of a NAND flash memory array.
Figure 4:
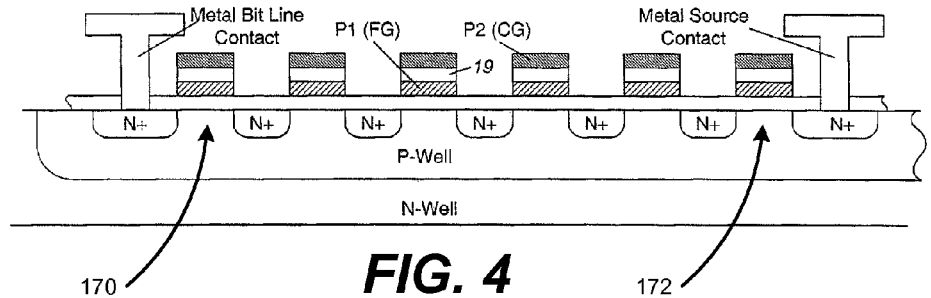
FIG. 4 is an orthogonal cross-sectional view taken along line A-A of the portion of the flash memory array depicted in FIG. 4.

A portion of a traditional NAND memory array is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
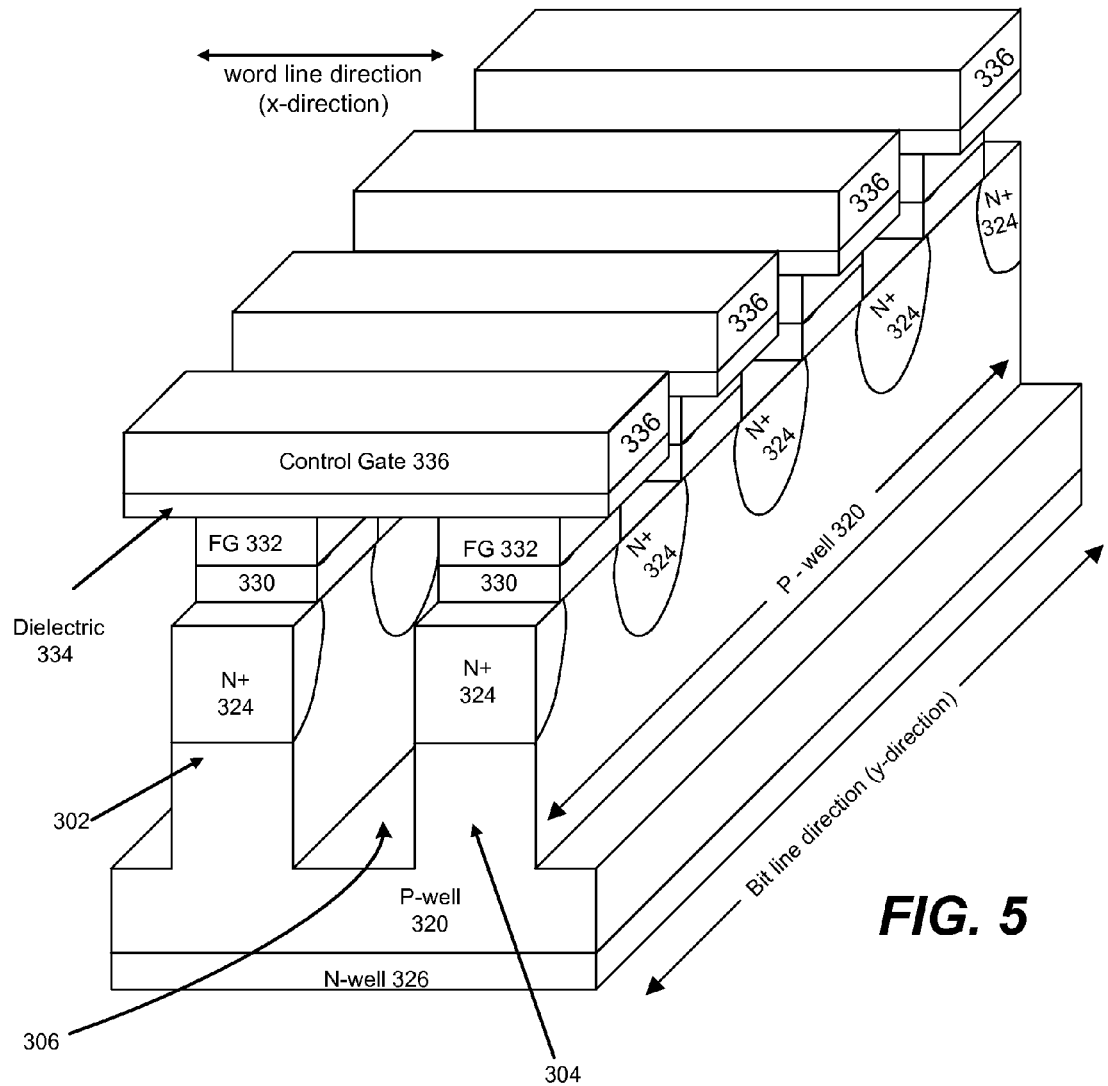
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by an open area or void 306. Typically, an insulating material or dielectric is formed between adjacent NAND strings in this open area.

Figure 6:
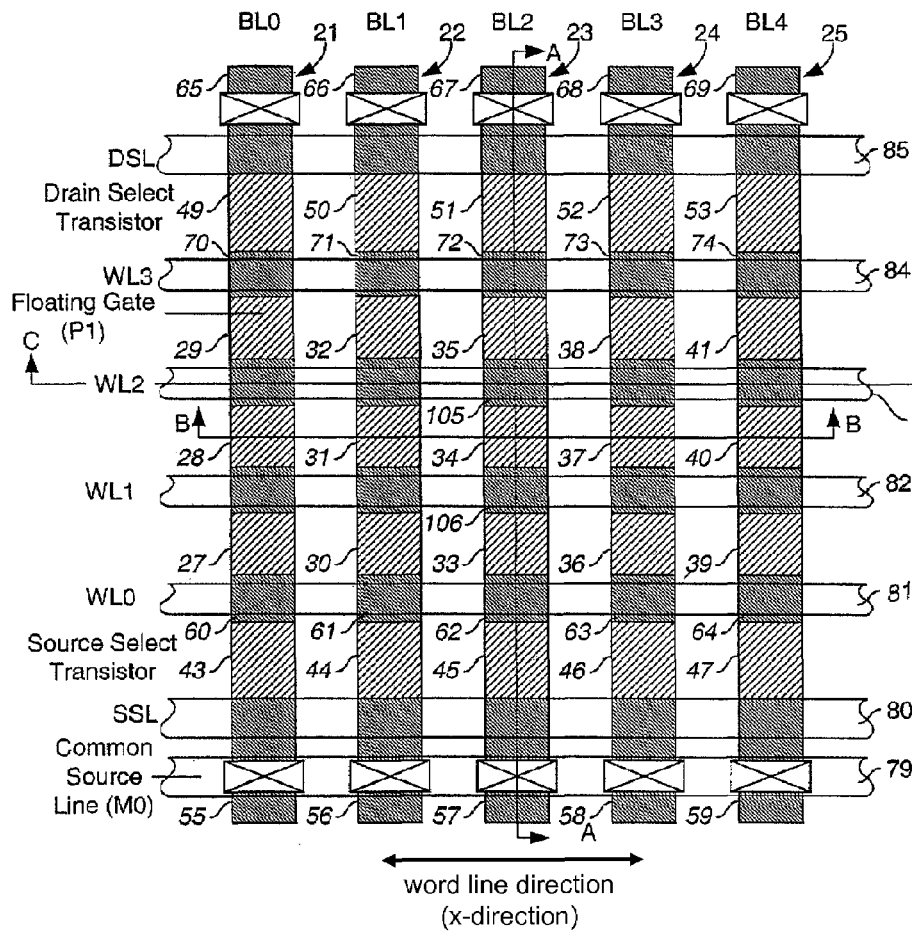
FIG. 6 is a plan view of a portion of a NAND flash memory array having a dual control-gate structure.

A NAND memory array having two control gates per memory cell is illustrated in plan view in FIG. 6. Five NAND strings 21-25 of series connected memory cells are included, with three floating gates or charge storage elements shown in each string. String 21 includes floating gates 27, 28, 29, string 22 includes floating gates 30, 31, 32, string 23 includes floating gates 33, 34, 35, string 24 includes floating gates 36, 37, 38, and string 25 includes floating gates 39, 40, and 41. Only a small rectangular array of fifteen memory cells is illustrated for ease of explanation. Actual implementations of such an array would typically include millions of such memory cells forming thousands of NAND strings, each string normally having 16, 32 or more memory cells.

Each NAND string includes two select transistors, one at each end of the string, to controllably connect the string between a different one of global bit lines BL0-BL4 and a common source line. A voltage is applied to respective source select gates 43-47 to controllable connection of one end of their respective memory cell strings 21-25 to the common source line. The other ends of the strings 21-25 are connected through respective drain select transistors 49-53 to the respective bit lines BL0-BL4. Column control circuitry applies a voltage to each bit line that is representative of the specific data to be written, or to sense the voltage or current of a corresponding string or memory cell during a read or verify operation. The select transistors include respective source and drain regions 55-64 and 65-74 in a semiconductor substrate.

Control gate (word) lines 81-84 are positioned between the floating gates instead of on top of them as in traditional NAND memory arrays. Each control gate line extends across multiple strings of memory cells and is capacitively coupled through a suitable insulating dielectric, such as multi-layer oxide-nitride-oxide (ONO), to the floating gates on both sides. Additional coupling area is obtained by using the sidewall areas of both sides of the floating gates. The floating gates can be made thicker (higher) than usual in order to increase this coupling area, and the control gates in between them are then made to be at least as thick as the floating gates in order to take advantage of the added coupling area. An advantage is that this coupling area may be controlled largely independent of the coupling area of the floating gates and the substrate, resulting in a desirably high coupling ratio even as the coupling area of the floating gates with the substrate is reduced during decreases in device dimensions. The principles, devices and techniques disclosed hereinafter can be used with traditional NAND architectures having word lines positioned above floating gates, or architectures having word lines between the floating gates as shown in FIG. 6.

Two control gate or word lines replace a single word line of conventional NAND arrays in FIG. 6. For example, the word line that would extend across the row of floating gates 27, 30, 33, 36 and 39 in a conventional array is replaced by two control gate lines 81 and 82 (WL0 and WL1). Similarly, a word line that would normally extend across the row of floating gates 28, 31, 34, 37 and 40 is replaced by two control gate lines 82 and 83 (WL1 and WL2). The control lines 81-84 are elongated in the x-direction across the array and separated in the y-direction by the length of the intervening floating gates and the thicknesses of the dielectric layers between them. Although the size of the memory floating gate is typically made as small as the photolithography allows in both x and y dimensions, the channel length of the select transistors 43-47 and 49-53 (y-dimension) is typically slightly larger than the minimum feature size to ensure it can effectively block all conduction including leakage when the maximum voltage is applied across it.

Figure 7:
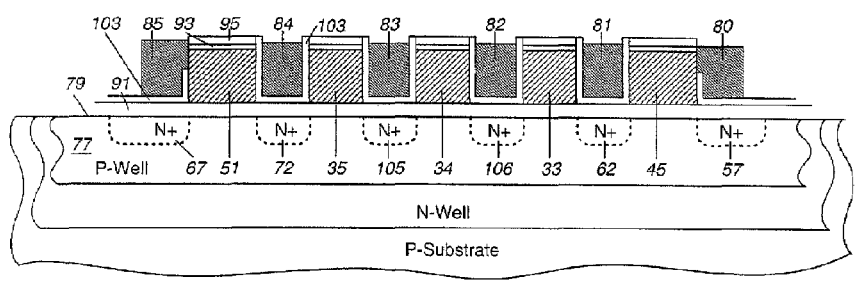
FIG. 7 is an orthogonal cross-sectional view taken along line A-A of the portion of the flash memory array depicted in FIG. 6.
Figure 8:
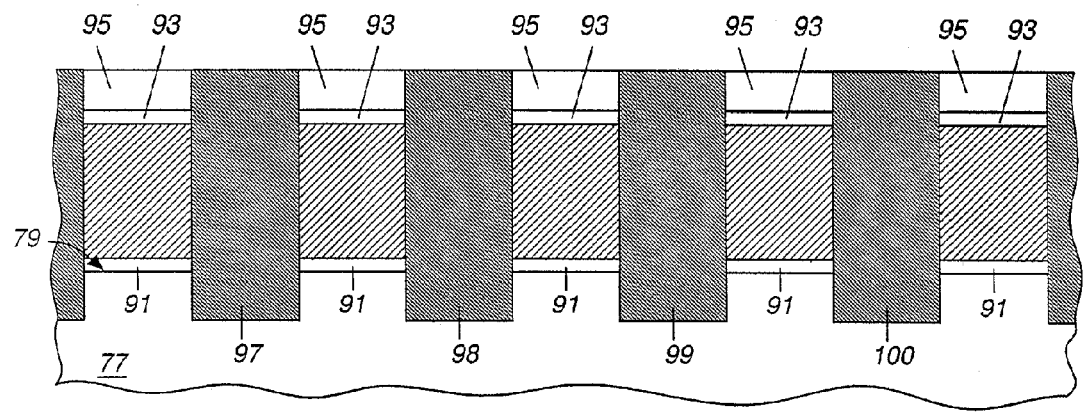
FIG. 8 is an orthogonal cross-sectional view taken along line B-B of the portion of the flash memory array depicted in FIG. 6.
Figure 9:
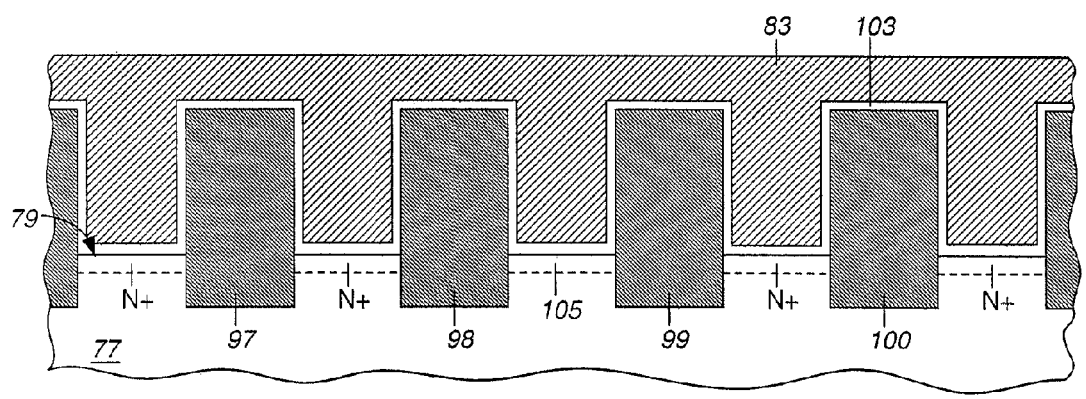
FIG. 9 is an orthogonal cross-sectional view taken along line C-C of the portion of the flash memory array depicted in FIG. 6.

FIG. 7 is an orthogonal cross-sectional view of the array shown in FIG. 6 taken along line A-A in the y-direction through one string of memory cells. FIG. 8 is an orthogonal cross-sectional view of the array taken along line B-B in the x-direction along a row of memory cells extending across multiple strings. FIG. 9 is a cross-sectional view of the array taken along line C-C in the x-direction along a word line. A layer 91 of tunnel dielectric (e.g., silicon oxide, $SiO_2$) is formed on the surface 79 of the substrate 77 to a thickness of about 8 nm. A first layer of the charge storage material (e.g., doped polysilicon) is formed over at least the area of the array from which the floating gates 51, 35, 34, 33 and 45 are formed.

Electrical isolation is provided between columns of floating gates by Shallow Trench Isolation (STI). The exposed substrate surface is anisotropically etched to form trenches 97-100 elongated in the y-direction and positioned between the polysilicon/dielectric stack strips in the x-direction. These trenches are etched to a depth of 100-300 nm in one embodiment. In other embodiments, trench depths of up to 1000 nm, 2000 nm or more can be used.

Additional trenches can be formed alongside the first polysilicon strips with lengths in the x-direction. Over the active regions these trenches extend the full height of the floating gate plus the thickness of masking layers 93 and 95, and over the field regions they will extend 100-200 nm. The control gate lines 81-84, select gate lines 80 and 85, and source and bit line contacts are formed in these trenches. Before forming these control gate lines, ions are implanted in the trenches, shown in the cross-sectional view of FIG. 7 as memory transistor and select gate implanted source and drain regions 67, 72, 105, 106, 62 and 57. A dielectric layer 103 is formed over the exposed surfaces of the structure, conforming to the sidewalls and bottom surfaces of the newly formed trenches. The layer 103 is ONO but may also be a material having a higher dielectric constant.

A second layer of doped polysilicon is deposited over the array area, completely filling the trenches and contacting the dielectric layer 103. This polysilicon is then removed from the top of the structure by CMP, resulting in control gate lines 81-84, the SSL line 80, and the DSL line 85. These lines are made to extend at least as high as the floating gates to which they are capacitively coupled through the dielectric layer 103.

Figure 10:
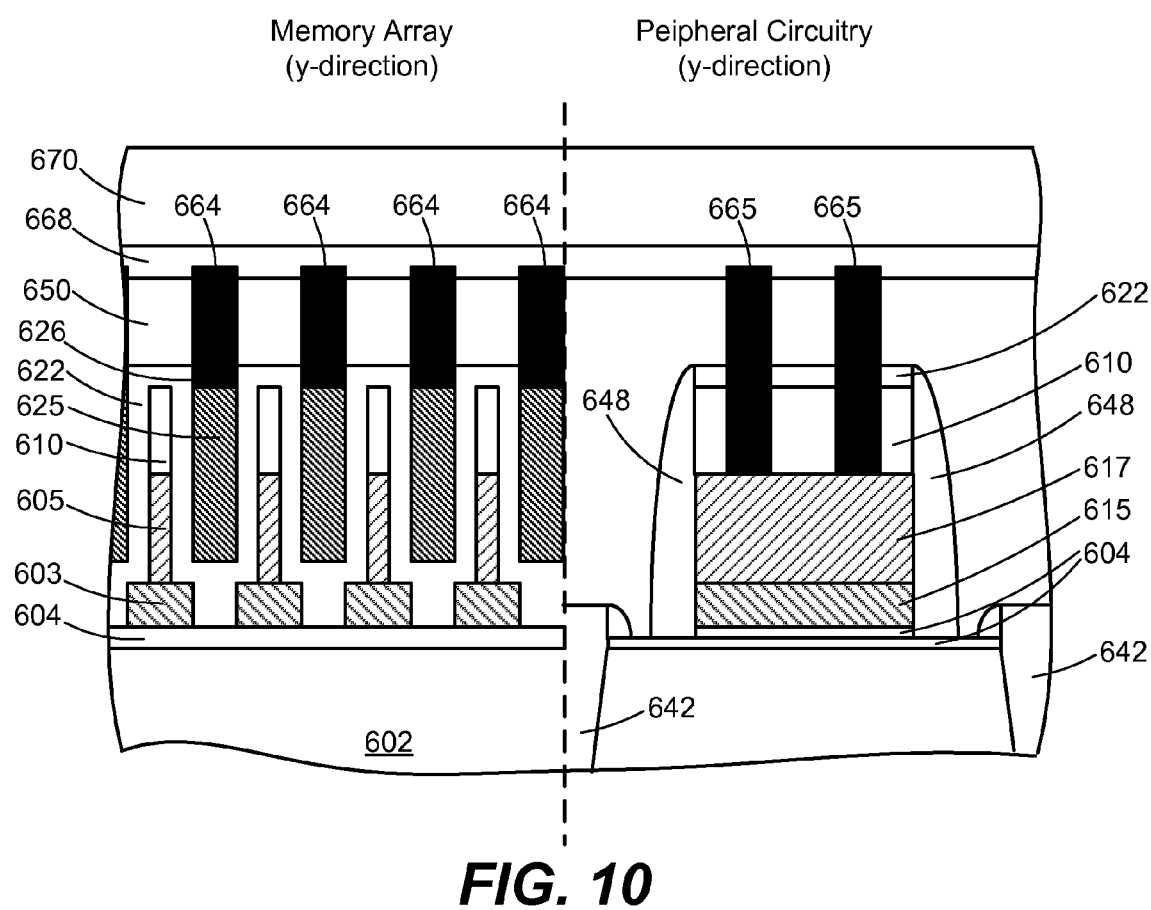
FIG. 10 is an orthogonal cross-sectional view through a portion of a NAND string of flash memory cells in accordance with one embodiment.

FIG. 10 is a cross-sectional view in the column or y-direction through a portion of a non-volatile memory formed using substrate 602. Tunnel dielectric layer 604 is formed across the surface of substrate 602 at a memory array region and peripheral circuitry region. The memory array region includes a cell area, a portion of which is depicted in FIG. 10 that includes four memory cells. Any number of memory cells can be included in a string of memory cells as earlier described. Each memory cell includes a composite charge storage structure having a first charge storage region 603 and a second charge storage region 605. The composite charge storage structures are separated from the substrate surface by the tunnel dielectric layer. A set of control gates 625 are formed between charge storage structures that are adjacent in the column direction and after the end charge storage structures on both ends of the string of cells (only of which is depicted). The control gates partially occupy the spaces between adjacent charge storage regions and are separated from the charge storage regions by an intermediate dielectric layer 622. As will be described hereinafter, the control gates 625 are not continuous in the row direction as with some memory devices. A set of control gate interconnects 664 are used to connect together a row of individual control gates, thereby extrinsically forming word lines for the array. At the peripheral circuitry region of the substrate, a transistor is formed that includes a gate region that is comprised of a first charge storage region 615 and a second charge storage region 617. Connections 665 are made to the gate region 617.

Figure 11A:
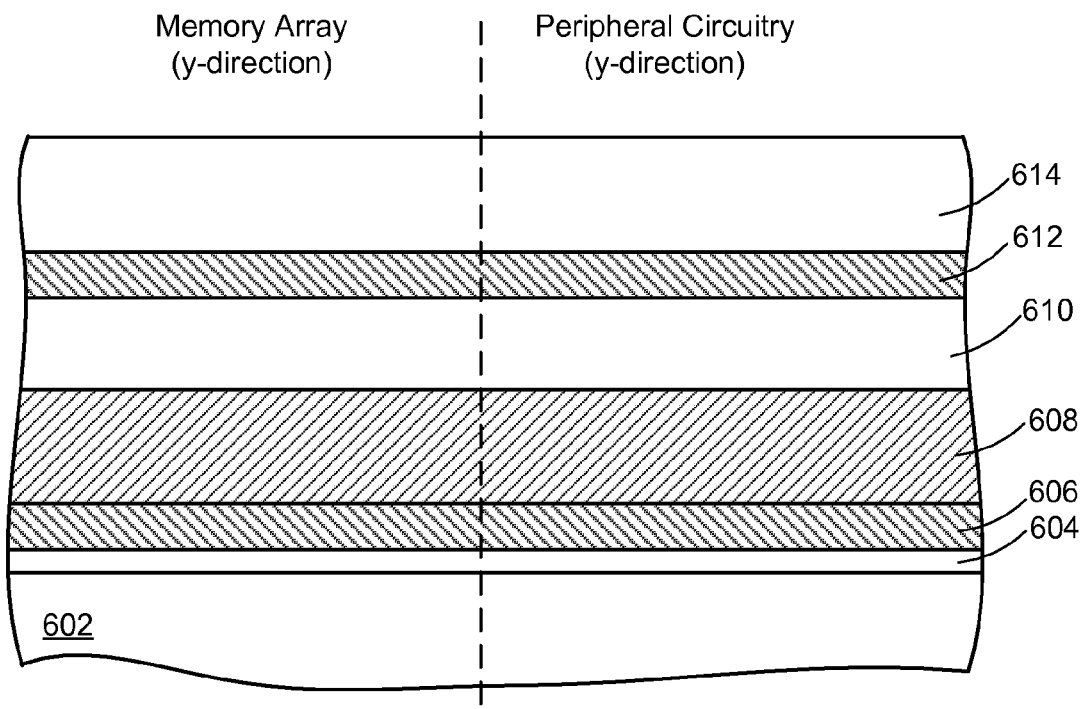
FIGS. 11A-11V are orthogonal cross-sectional views through a portion of a non-volatile memory array fabricated in accordance with one embodiment using pre-isolation cell formation that integrates peripheral circuitry formation.
Figure 11B:
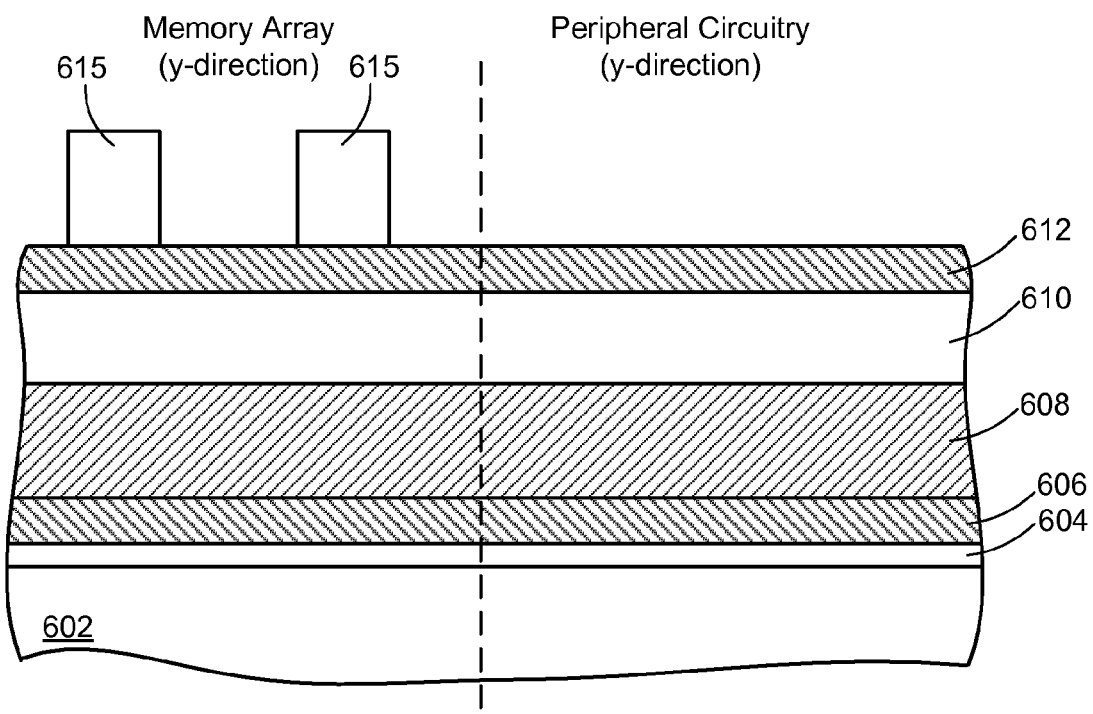
Figure 11C:
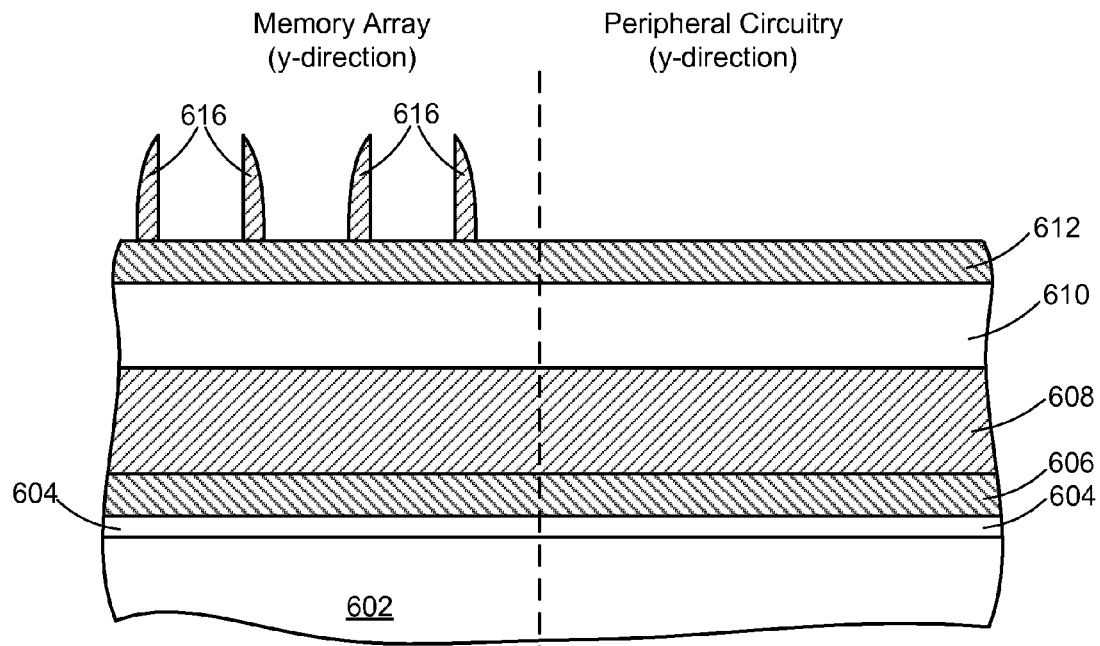
Figure 11D:
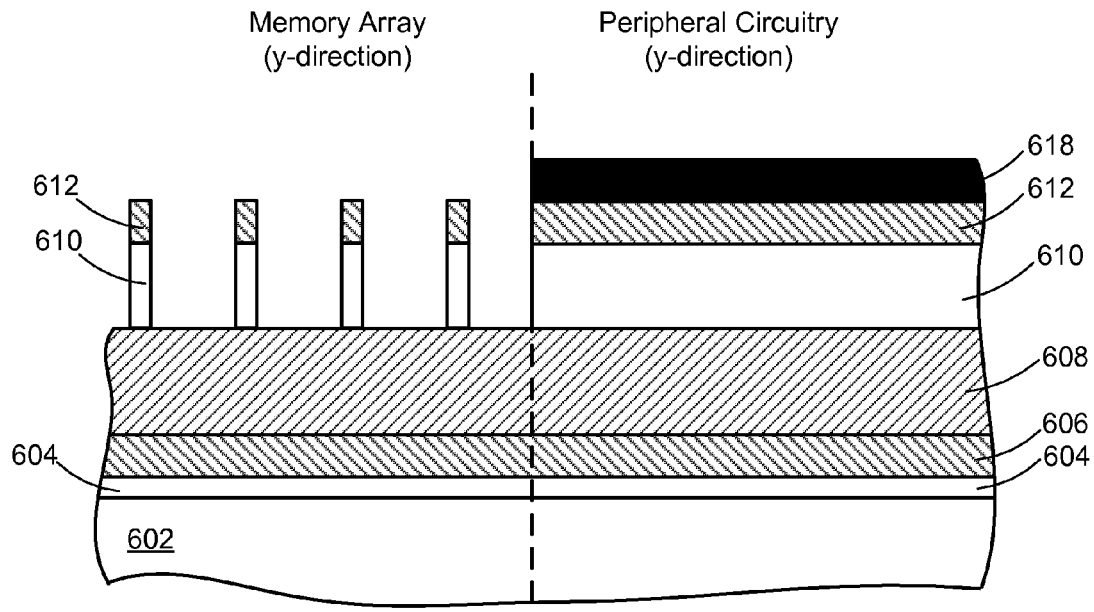
Figure 11E:
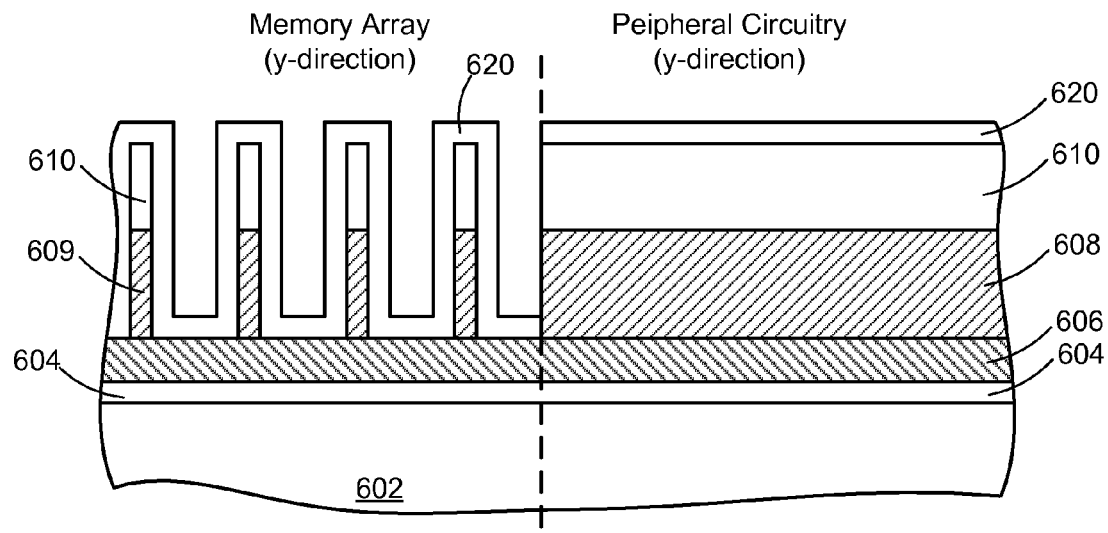
Figure 11F:
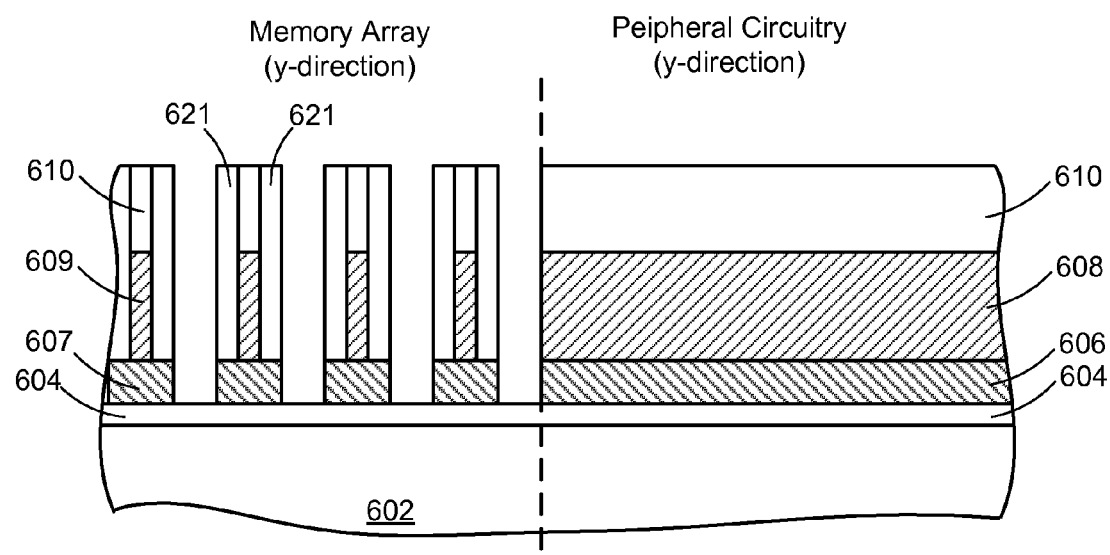
Figure 11G:
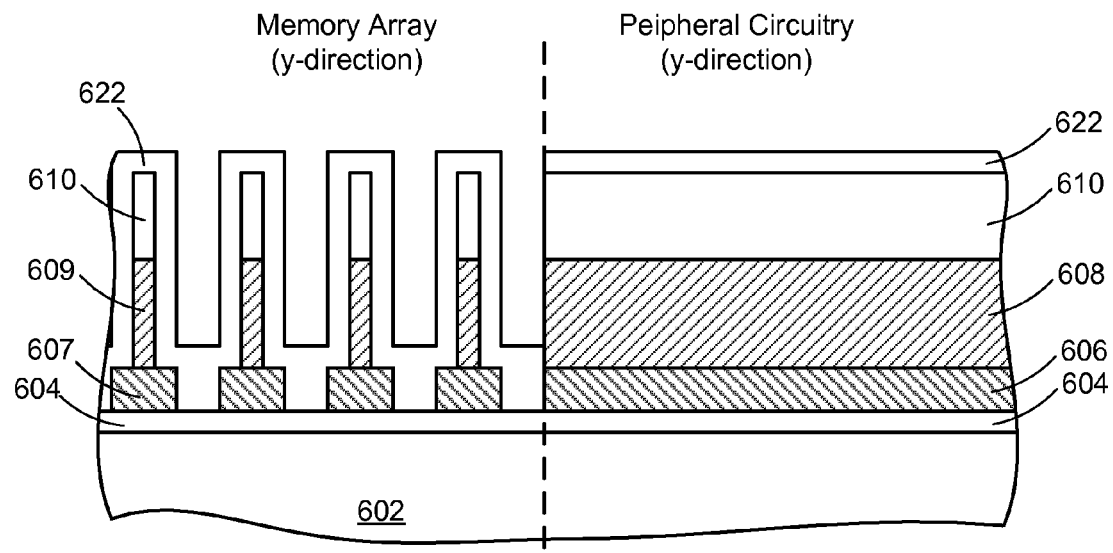
Figure 11H:
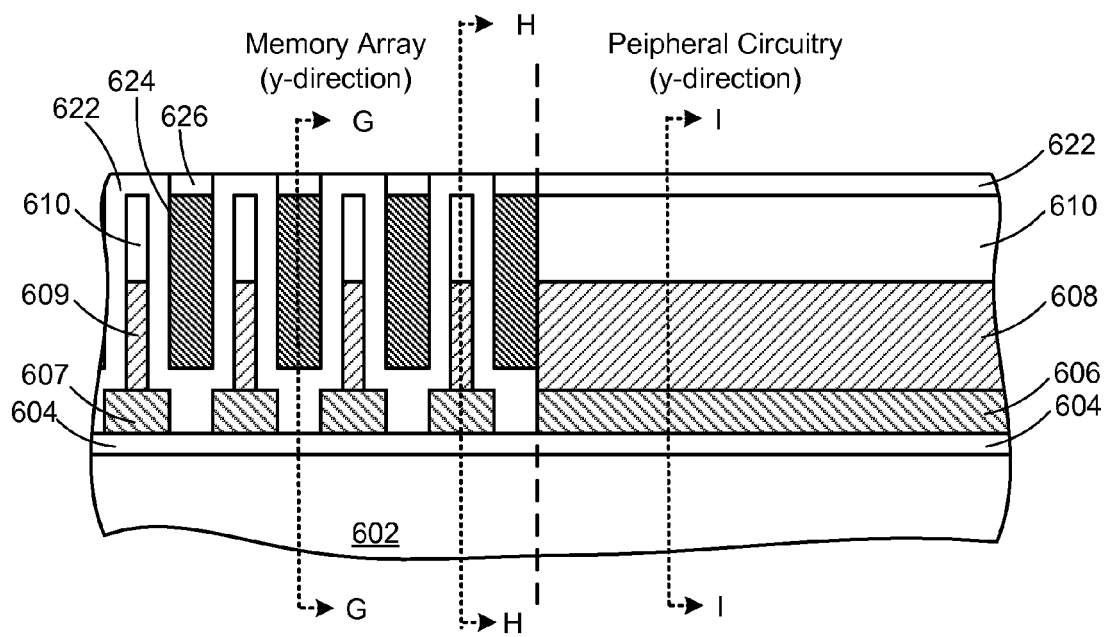
Figure 11I:
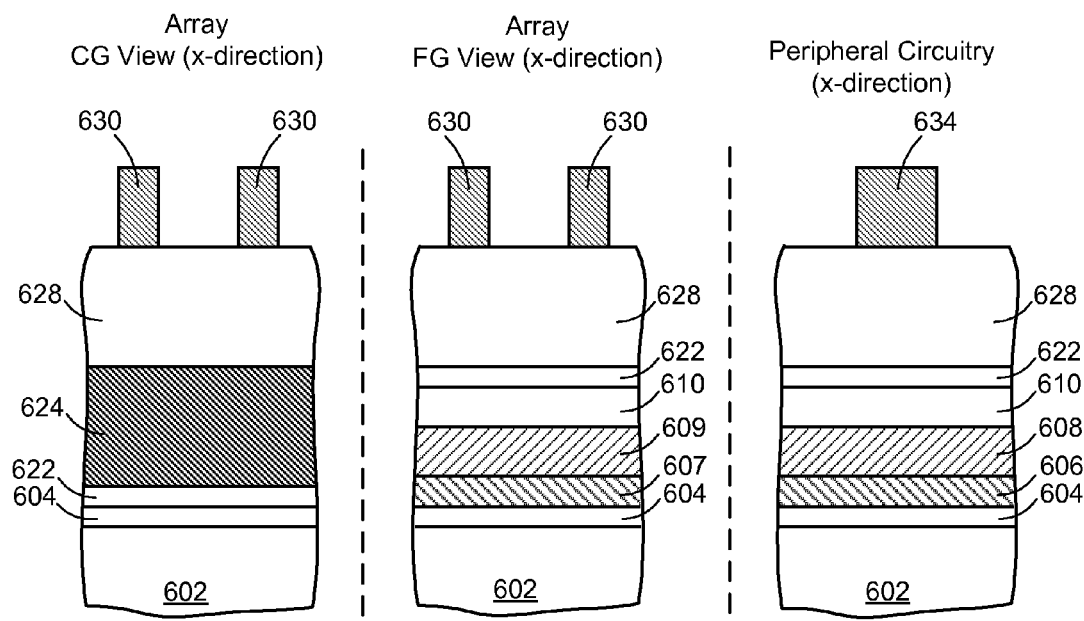
Figure 11J:
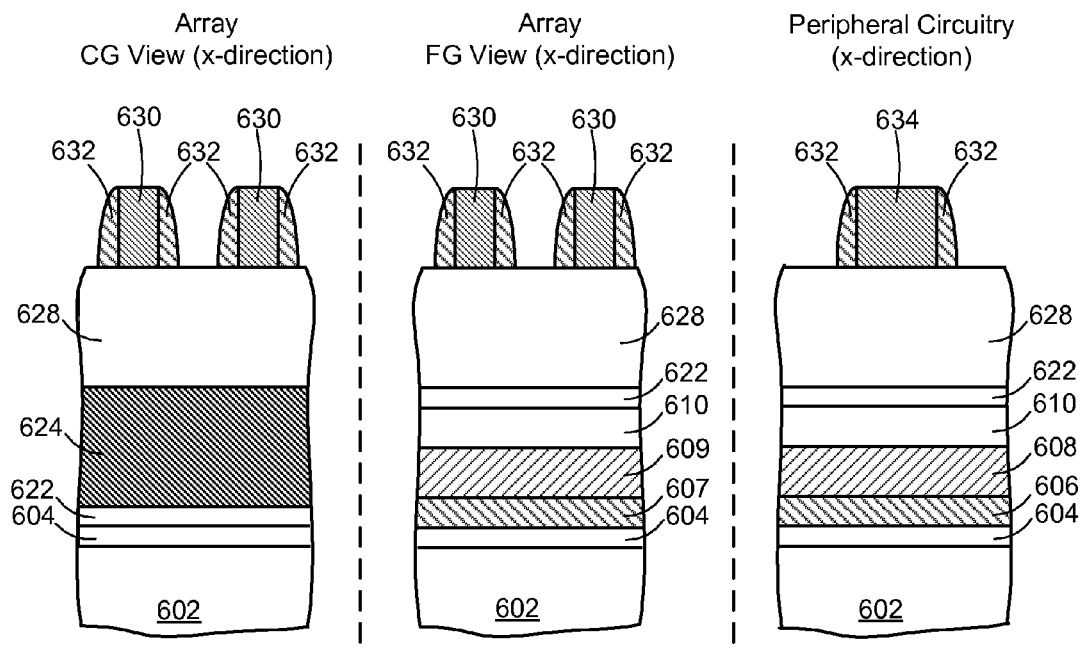
Figure 11K:
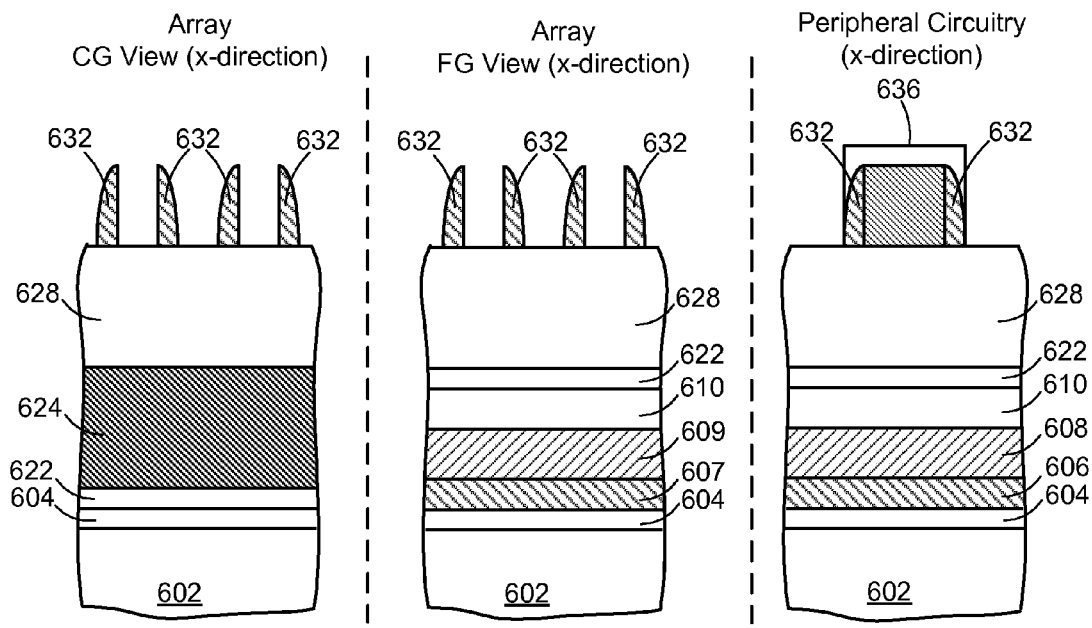
Figure 11L:
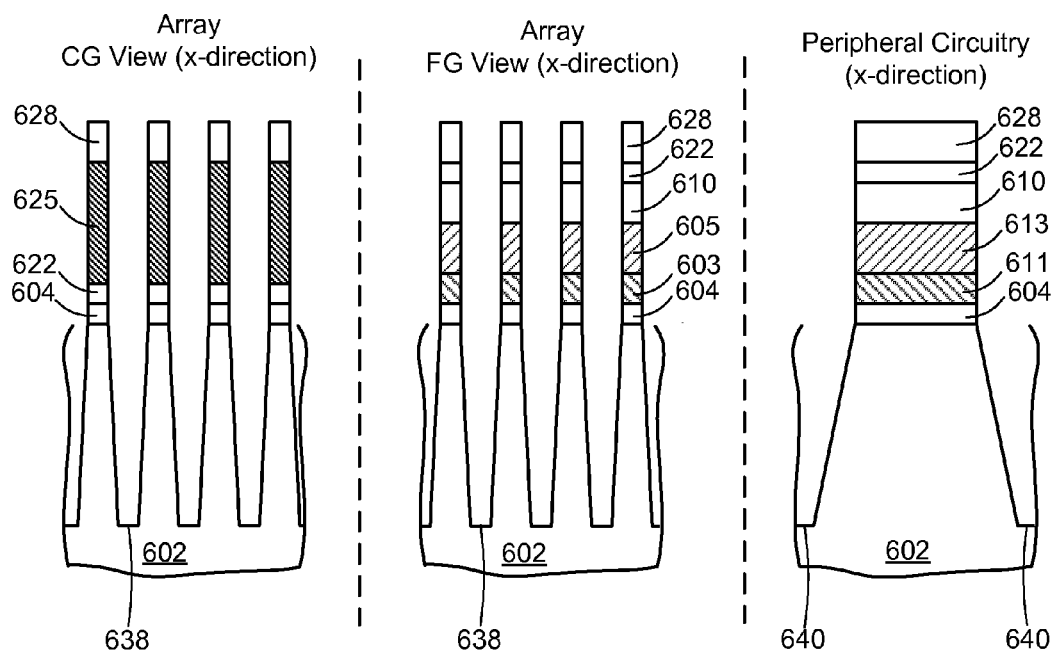
Figure 11M:
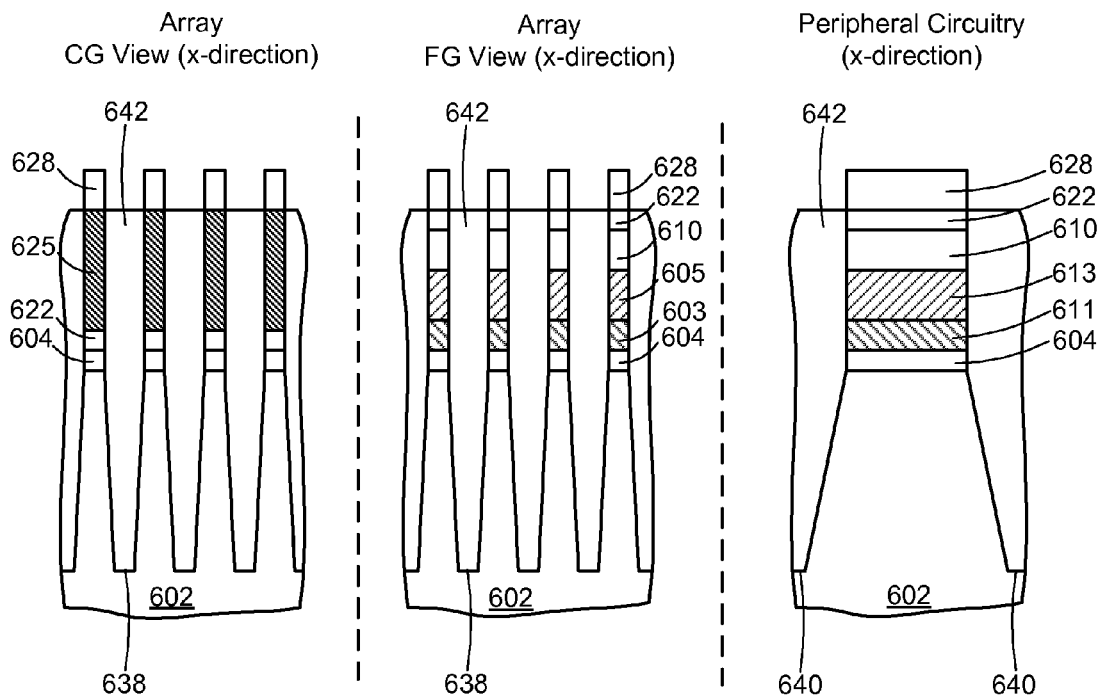
Figure 11N:
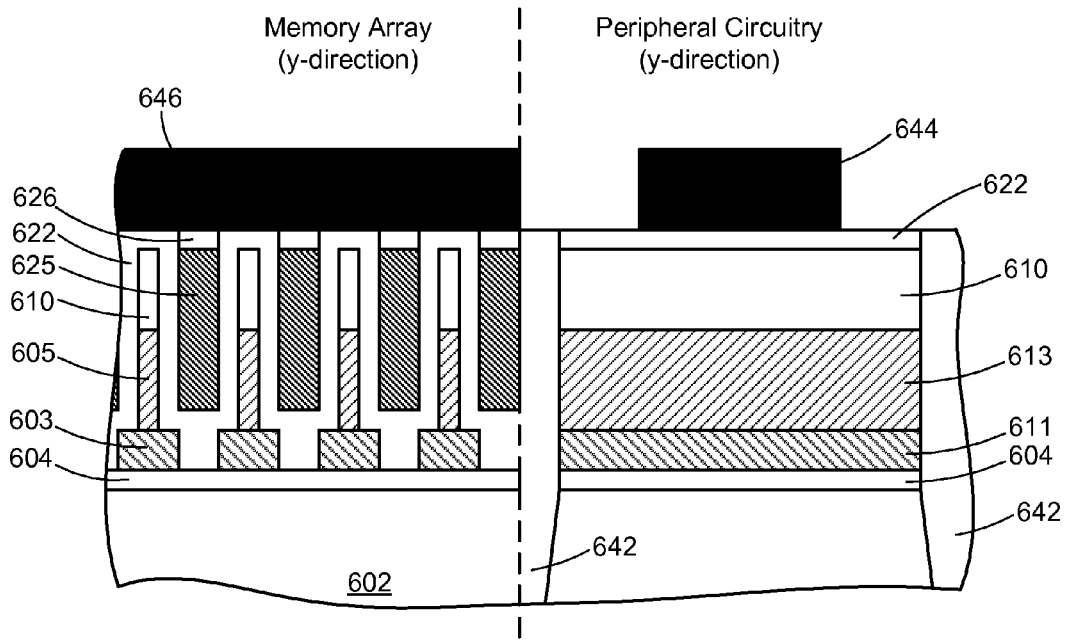
Figure 11O:
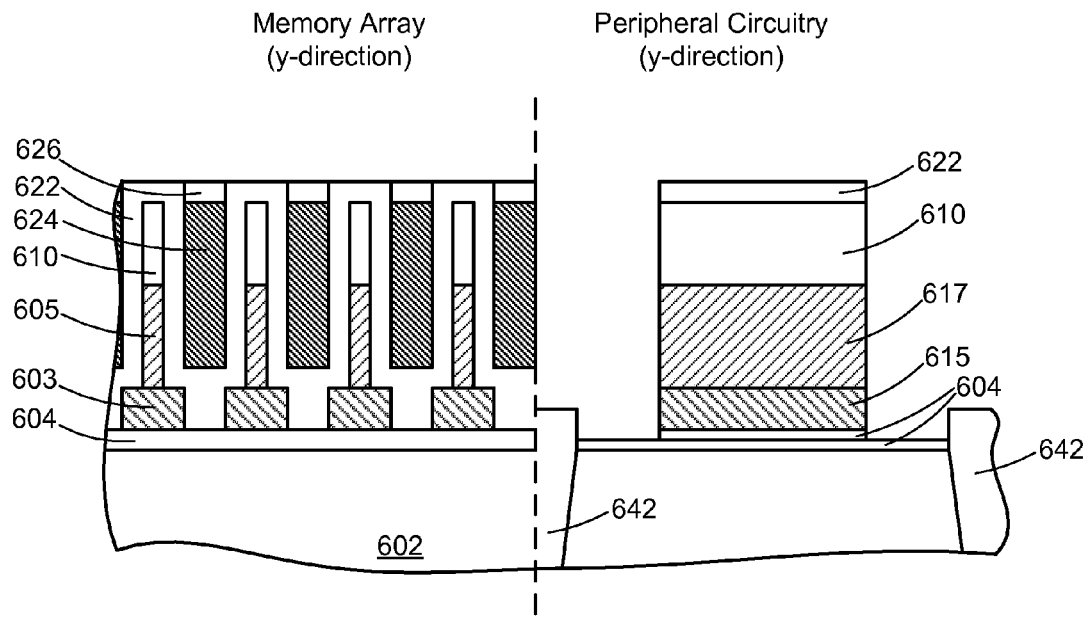
Figure 11P:
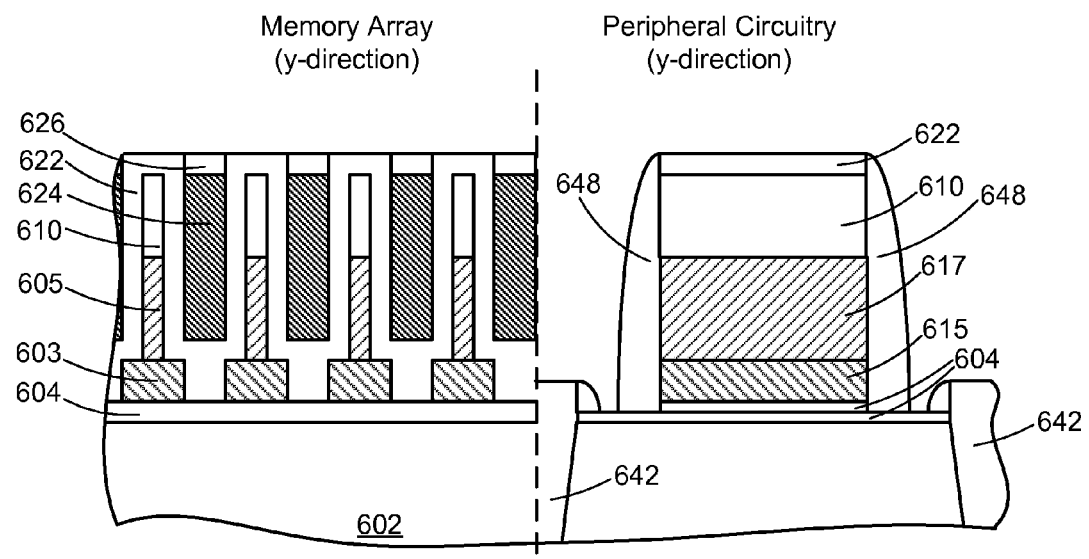
Figure 11Q:
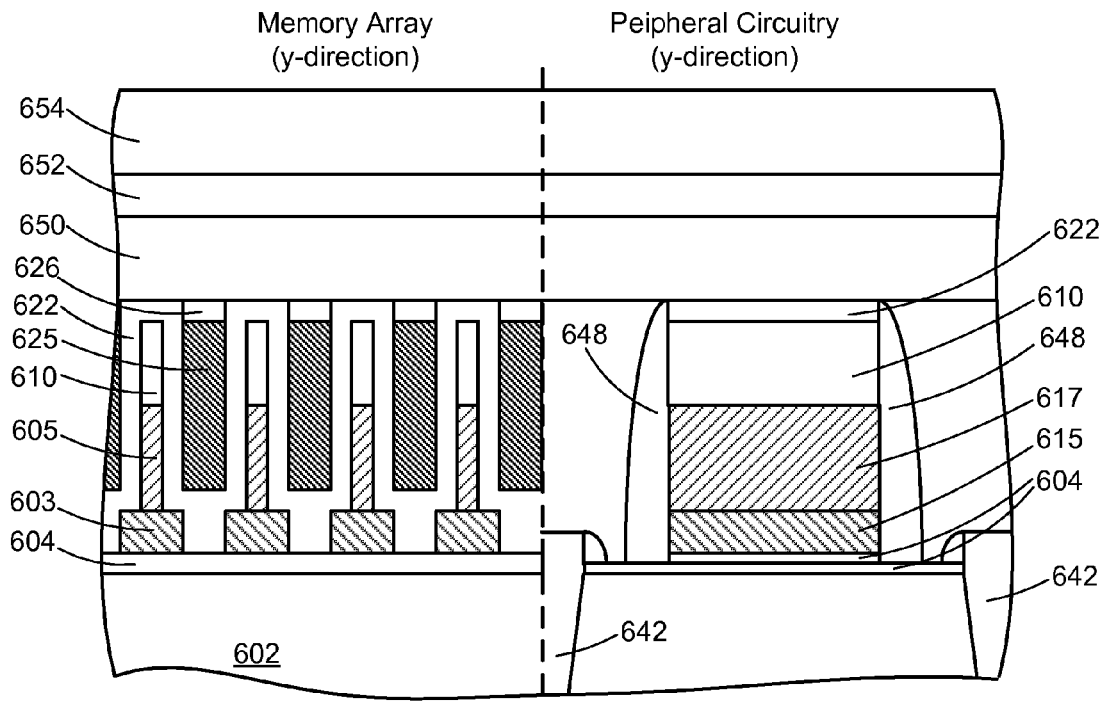
Figure 11R:
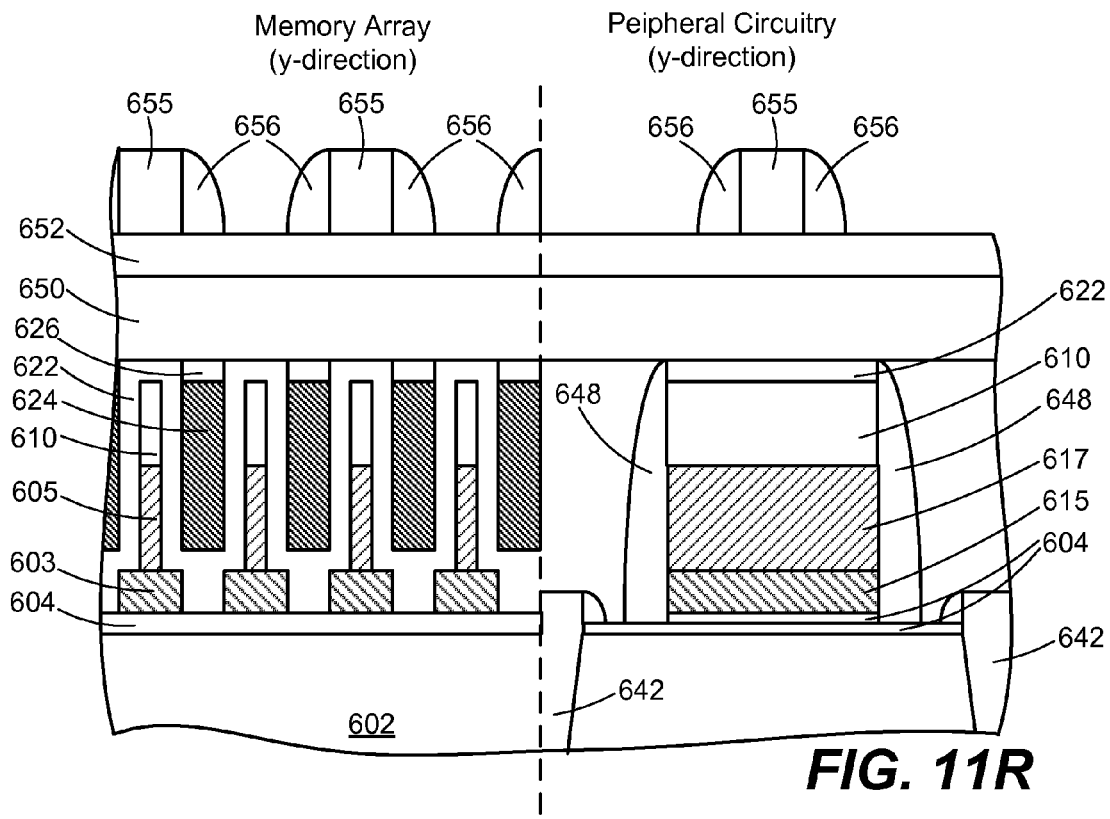
Figure 11S:
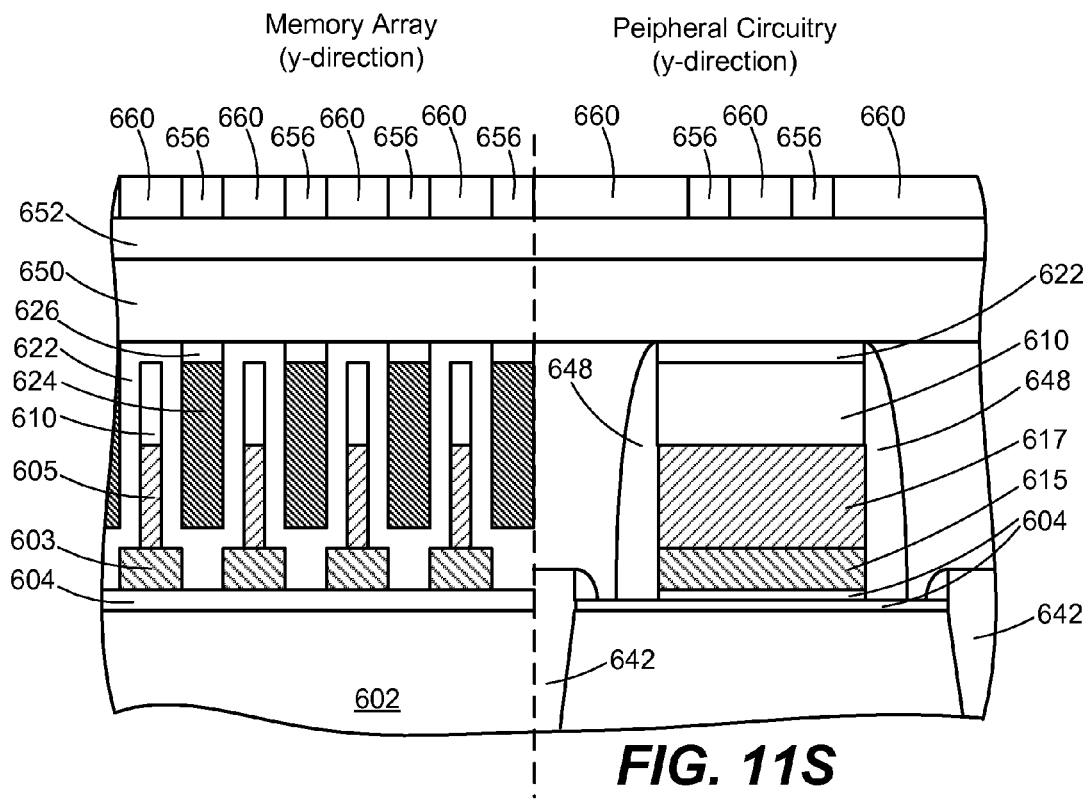
Figure 11T:
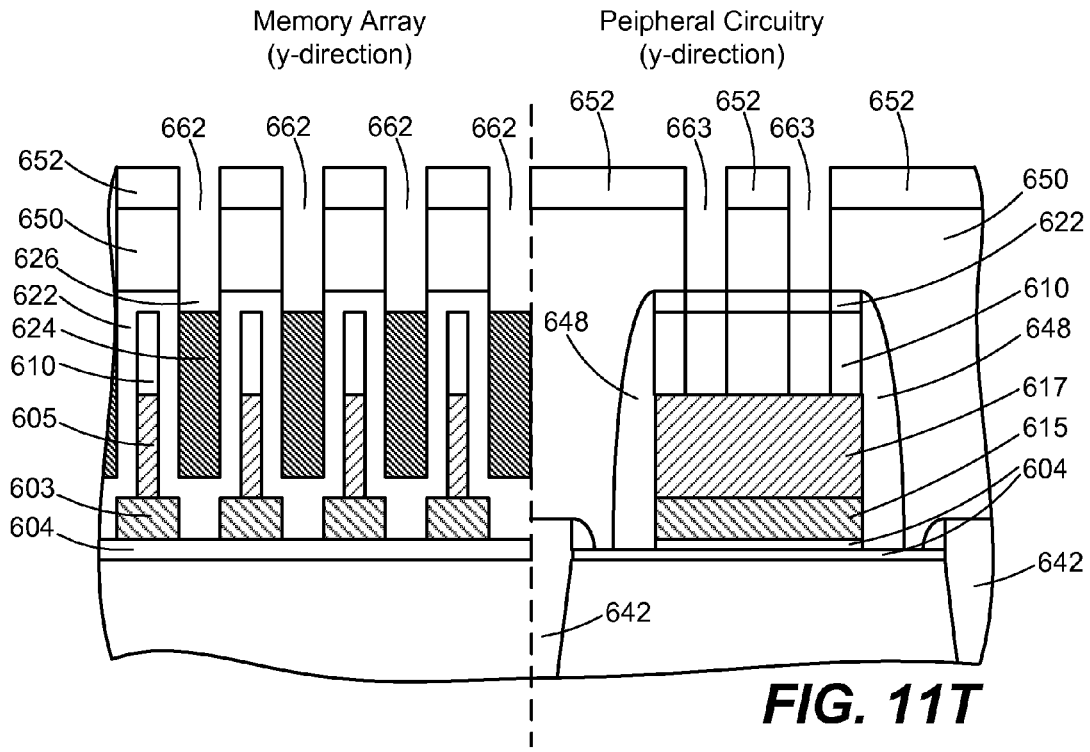
Figure 11U:
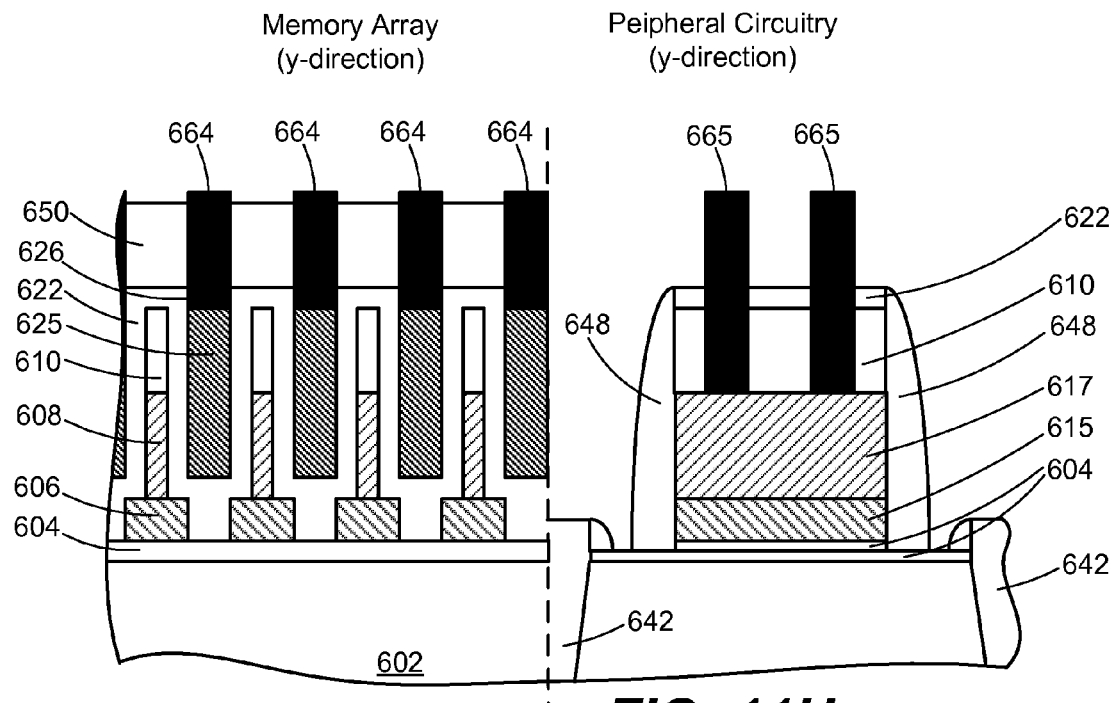
Figure 11V:
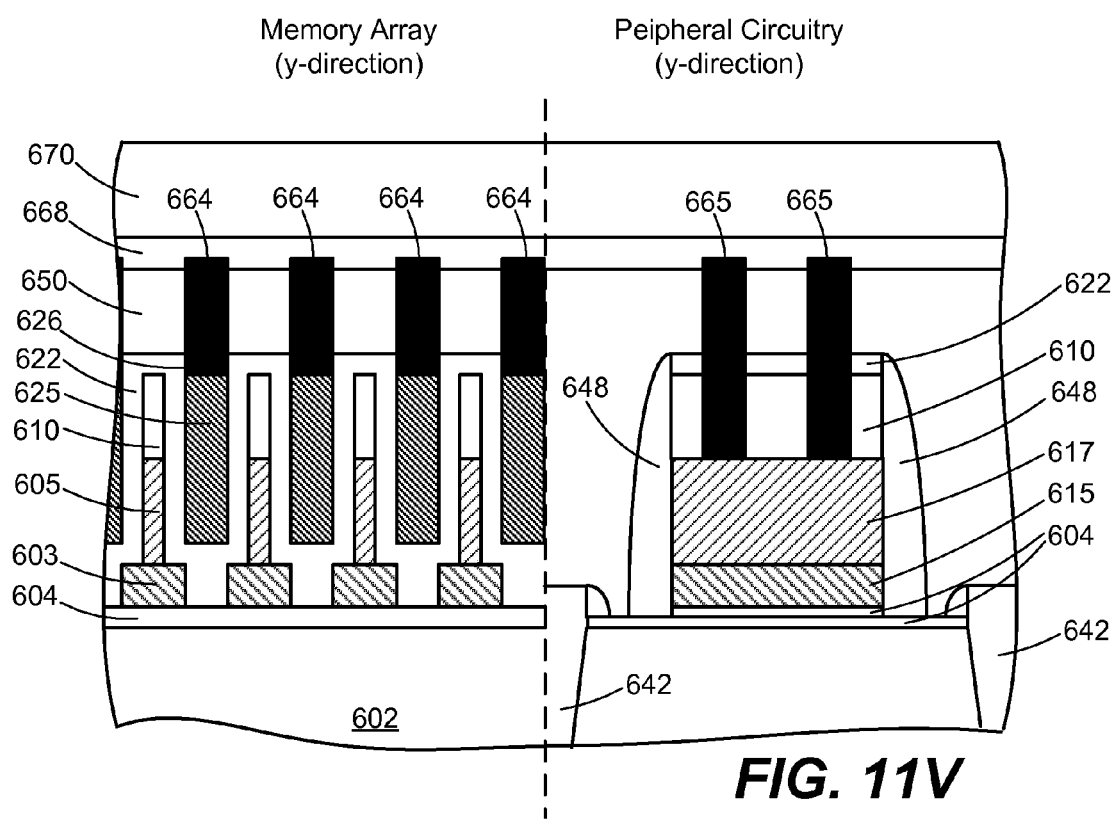

FIGS. 11A-11V are orthogonal cross-sectional views of portions of a non-volatile memory system depicting the fabrication of a memory array and peripheral circuitry in accordance with one embodiment of the disclosed technology. The depicted device includes memory cells with dual control gate structures and composite charge storage structures having an inverted-T shape. The described embodiment is exemplary only and its precise form should not be taken as limiting the disclosure. The exact materials, dimensions and order of processing may vary according to the requirements of a particular implementation. It is noted that the dimensions of the various features are not necessarily drawn to scale in these figures.

FIG. 11A is a cross-sectional view through a line such as line B-B of FIG. 6 in the row or x-direction. FIG. 11A depicts a portion of the memory array as well as a peripheral circuitry portion of the substrate. The peripheral circuitry portion can include circuitry such as high voltage transistors, logic transistors, etc. that form part of the row or column control circuitry for the memory array. Although not depicted, one or more wells (e.g., a triple well) are typically formed in a substrate prior to forming the layer stack over the substrate surface. A zero layer formation step may precede well formation. Additionally, after implanting and associated annealing of the well(s) to dope the substrate, a high voltage gate dielectric region (not shown) can be formed in the substrate at the peripheral circuitry region. A thick layer of SiO2 can be grown to an exemplary depth of about 340 A-380 A for a gate dielectric region in one embodiment.

A layer 604 of tunnel dielectric material is formed over the substrate surface after forming the optional gate oxide region at the peripheral circuitry region. A thin layer of oxide (SiO2) is grown in one embodiment to a depth of about 100A, although different materials, processes and dimensions can be used for the tunnel dielectric. A first layer 606 of charge storage material is formed over the substrate surface after forming the tunnel dielectric. The first layer is formed over the surface of the substrate at both the memory array region and the peripheral circuitry region of the substrate. At the memory array region, the first layer is separated from the substrate surface by the tunnel dielectric layer 604. At the peripheral circuitry region, the first layer is separated from the substrate surface by the gate dielectric region 606. It is noted that a layer may said to be over another layer when one or more intervening layers are between the two layers, as well as when the two layers are in direct contact. The first charge storage layer can be doped polysilicon, undoped polysilicon, a dielectric charge storage material, or other suitable material. Different thicknesses can be used for the first charge storage layer. By way of non-limiting example, one embodiment includes a 400 A thickness for the first charge storage layer. In another, a 200 A thickness is used. For ease of explanation, reference may be made to specific dimensions and/or materials hereinafter but it will be appreciated that these may vary as noted.

A second charge storage layer 608 is formed over the substrate surface at the array and peripheral regions of the substrate. The second charge storage layer overlies the first charge storage layer at the array region and the peripheral region of the substrate. Like the first charge storage layer, the second can include doped polysilicon, undoped polysilicon, a dielectric charge storage material, or other suitable material. The second charge storage layer is not necessarily formed of the same material as the first charge storage layer, although it can be. In one embodiment, the first charge storage layer is undoped polysilicon and the second charge storage layer is doped polysilicon. The thickness of layer 608 can vary as well. In one embodiment, layer 606 and layer 608 are both 400 A. In another, layer 606 is 200 A and layer 608 is 600 A. Different relative and total thicknesses of layers 606 and 608 are contemplated.

A pad (e.g., high temperature oxide) layer 610 is formed over the second layer 608 of charge storage material at the memory array region and peripheral circuitry region. A 500 A pad layer is used in one embodiment although other thicknesses can be used to suit the needs of particular implementations. Over the pad layer is formed an assist layer 612 that matches or substantially matches the material composition of later formed spacers is formed over pad layer 610. This optional assist layer, for which more detail is provided hereinafter, can provide etch stop capabilities and adhesive qualities during spacer formation. A hard mask 614, e.g., SiN, is then formed over the etch stop layer to a depth of about 1100 A in one embodiment.

After forming the layer stack, a series of steps are performed to provide a pattern for etching the second charge storage layer. A pattern of photoresist or other suitable material is provided in one embodiment to first etch the hard mask layer 614 to form sacrificial features at the memory array region. Strips of photoresist elongated in the column direction can be patterned over the hard mask layer followed by etching to form sacrificial features 615 shown in FIG. 11B. The peripheral circuitry region is not patterned so that etching removes the sacrificial material completely from this area of the substrate.

After forming the sacrificial features, a layer of spacer material is deposited and etched back to form a set of spacers 616 at the memory array region as depicted in FIG. 11C. After etching back the spacer material, the sacrificial features are removed, using a chemical wet etch, for example, to strip the nitride from the assist layer. A layer of polysilicon is deposited using a conformal process with a target thickness of 100 A in one embodiment. The layer is etched back to form spacers with a dimension in the row direction approximately equal to the target thickness. Etching back the polysilicon exposes the underlying etch stop layer 618 at portions not covered by features 615 or spacers 616. Etching removes the polysilicon from the peripheral circuitry area.

FIG. 11C depicts the substrate after removing the sacrificial features 615, using a chemical wet etch for example to strip the oxide from the surface of the polysilicon etch stop layer. The resulting spacers 616 form a mask over the layer stack for etching the second charge storage layer to define the dimension in the column direction for the charge storage regions formed therefrom. The assist layer 612 can provide a number of functions in the spacer-formation process. First, the assist layer can provide an etch stop for the wet etch process used to strip the sacrificial features. The assist layer can also provide a stable base for the subsequently formed spacers. For example, the material composition of the assist layer is chosen to provide adequate adhesion for the thinly formed spacers. A matched material composition for the spacers and assist layer facilitates adhesion between the spacers and the underlying layer. For example, the assist layer and spacer material are both polysilicon in one embodiment to improve the stability of the spacers when the sacrificial features are removed. Similar materials that are not exactly the same may also be used to improve adhesion of the spacers to their base layer. Using similar materials for the spacers and intervening layer can also help with stresses between the different films. If layers of different materials are used, the different materials may have different coefficients of thermal expansion causing stress at the interface of the different materials. When the same or similar materials are used, matching thermal coefficients can decrease stresses at the material interfaces. More details regarding the use of an assist layer 612 can be found in U.S. patent application Ser. No. 11/623,314, entitled "Method Of Forming Spacer Patterns Using Assist Layer for High Density Semiconductor Devices," by Pham, et al., filed Jan. 15, 2007.

After stripping the sacrificial features, the peripheral circuitry is covered with a strip of photoresist 618, depicted in FIG. 11D, before etching the layer stack. The assist layer 612 is first etched using non-selective reactive ion etching for example. A selective etch process can then be used to etch the HTO pad layer 610 using the spacers 616 as mask. The photoresist can then be removed from the peripheral circuitry region. Using the spacers as a mask at the memory array region and the assist layer 612 as a mask at the peripheral circuitry region, the second layer 608 of charge storage material is etched as depicted in FIG. 11E. Etching results in strips 609 of the second charge storage layer that are elongated in the row direction across the substrate. The dimension of the spacers defines the dimension of these strips in the column direction. Etching will consume all or most of the assist layer at the peripheral circuitry region. Etching is performed until the first layer 606 of charge storage material is reached. A timed process is used in one embodiment with a target thickness set to the desired thickness of the second charge storage regions. In another embodiment, an etch stop layer is formed between the charge storage layers. The etch stop layer can be a metal such as TiN, for example, to selectively etch the second charge storage layer without overetching the first charge storage layer.

FIG. 11E also depicts a layer 620 of spacer material formed over the substrate after etching the second charge storage layer 608. The spacer material is a layer of SiN deposited with a target thickness of about 100 A in one embodiment. The spacer layer is etched back as shown in FIG. 11F to form a set of spacers 621 along the sidewalls of the strips 609 of the second charge storage layer. Etching back will remove the spacer layer from the peripheral circuitry region of the substrate. Using the spacers as a mask, the first charge storage layer 606 is etched to form a set of strips 607 that are elongated in the row direction across the substrate. The combined length in the column direction of two spacers 621 and a strip 609 of the second charge storage layer define the length of the strips 607 in the column direction.

After etching the first charge storage layer, the spacers are removed, using a chemical wet etch for example. After removing the spacers, an intermediate layer 622 of dielectric material is formed over the substrate at both the memory array region and peripheral circuitry region as shown in FIG. 11G. The intermediate layer is a triple layer in one embodiment, formed of oxide-nitride-oxide.

Strips 624 of control gate material are formed to at least partially occupy the spaces between second charge storage regions that are adjacent in the column direction. A layer of conductive material such as polysilicon can be deposited and etched back to form the individual strips of material. A layer of oxide or other suitable material is deposited and etched back to from strips 626 that occupy the remaining space between adjacent charge storage regions.

Having formed strips of charge storage and control gate material that are elongated in the row direction across the substrate, processing proceeds to form multiple columns of individual charge storage structures by dividing the strips along their lengths in the row direction. FIG. 11I depicts three cross-sectional views through the substrate in the row direction after the previously described processing. The CG View is taken along line G-G at the memory array region in FIG. 11H depicting a cross-section view that includes the control gate strips. The FG view is taken along line H-H at the memory array region in FIG. 11H depicting a cross-section view that includes the strips of charge storage material. The peripheral circuitry view is taken along line I-I at the peripheral circuitry region in FIG. 11H.

A hard masking layer of 628 is formed over the substrate at the array and peripheral circuitry regions as depicted in FIG. 11I. The hard mask layer is a layer of SiN in one embodiment. A sacrificial layer, e.g., oxide, is formed over the hard mask layer and patterned and etched to form sacrificial features 630 at the array region and sacrificial feature 634 at the peripheral circuitry region. Feature 634 includes a larger dimension in the row direction than features 630.

FIG. 11J depicts the substrate after forming spacers 632 along the substantially vertical sidewalls of features 630. The spacers are polysilicon in one embodiment. FIG. 11K depicts the substrate after covering feature 634 and spacers 632 at the peripheral circuitry region with a strip 636 of photoresist. FIG. 11K also depicts the substrate after removing the sacrificial features 630. In an alternate embodiment, feature 634 can be removed prior to forming the strip 636 of photoresist. After removing the sacrificial features from the array region, the photoresist strip 636 can be removed from the peripheral circuitry region, leaving the spacers 632 and feature 634 at the peripheral circuitry region.

Using the spacers 632 as a mask at the array region and the combination of feature 634 and spacers 632 as a mask at the peripheral circuitry region, the layer stack is etched as shown in FIG. 11L. Etching continues through the entire layer stack, forming columns of the layers that are elongated in the column direction across the substrate at the memory array region. At the peripheral circuitry region, a single column is etched according to the pattern. The layer column for the peripheral circuitry includes a much larger dimension in the row direction as a result of the larger pattern employed there. Etching the strips 624 of control gate material divides the strips along their lengths in the row direction, thereby forming individual disconnected control gates 625 in the row direction. Etching the strips 609 of the second charge storage layer and the strips 607 of the first charge storage layer at the array region divides these strips along their lengths in the row direction to form individual charge storage structures each including a first charge storage region 603 resulting from a strip of the first charge storage layer and a second charge storage region 605 resulting from a strip of the second charge storage layer. At the peripheral circuitry region, layer 606 and 608 are etched to form a first gate region 611 and second gate region 613.

Etching continues at exposed portions of the substrate between active areas of the substrate underlying the columns of the layer stack at the array region and exposed portions of the substrate at the peripheral circuitry region. Isolation trenches 638 are formed at the array region and isolation trenches 640 are formed at the peripheral circuitry region.

FIG. 11M depicts the substrate after forming an insulating dielectric 642 in the isolation trenches at the array and peripheral circuitry regions. A layer of SiO2 is deposited and etched back in one embodiment to form the insulating material. Chemical mechanical polishing can be used to recess the oxide below the upper surface of the hard mask layer. The hard masking layer is then removed.

FIG. 11N again depicts a cross-sectional view of the substrate in the column direction. At the array region, a layer 646 of resist is patterned to protect the memory cells. At the array region, a pattern 644 for etching to define the dimension of the peripheral gate regions in the column direction is formed. A stacked mask process can be used in one embodiment, including a coat of resist and SOG coat for pattern 644 for example. Using the pattern 644 as a mask, the layer stack is etched at the peripheral region as shown in FIG. 11O. The strip 613 of the second charge storage layer is etched to form a second gate region 617 and the strip 611 of the first charge storage layer is etched to form a first gate region 615. The peripheral circuitry 642 is recessed as a result of etching. FIG. 11P depicts the substrate after forming a high temperate oxide or TEOS spacer along the sidewalls of the stack resulting from the previous etching at the peripheral region.

FIG. 11Q depicts the substrate after forming a layer of oxide, e.g., TEOS, or other suitable material at the array and peripheral regions. An assist layer 652 is formed over the oxide, followed by a sacrificial layer 654 of SiN for example. The sacrificial layer is patterned and etched to form features 655 depicted in FIG. 11R. Spacers 656 are formed along the sidewalls of features 645. FIG. 11S depicts the substrate after removing the sacrificial features and depositing a layer 660 of oxide or other suitable material. The oxide is polished to form a planar surface. The remaining portions of spacers 656 are then removed and layer 660 is used as mask to etch trenches 662 down to the control gates 625 at the memory array region and openings 663 down to the second charge storage region 617 at the peripheral circuitry region as shown in FIG. 11T. Openings 663 are single contact holes for connecting to a single peripheral transistor in one embodiment. In others, openings 663 can be trenches so that multiple transistors in the row direction can be connected to a common control signal. A layer of conductive material is deposited and polished to fill trenches 662 and openings 663 as shown in FIG. 11U. Polysilicon is used in one embodiment. At the array region, control gate connections 664 are formed that extend in the row direction across multiple columns of memory cells. The connections 664 can interconnect a row of discontinuous control gates that result from etching the active areas and isolation trenches after forming the control gate material. At the peripheral circuitry region, connections 665 can connect to one or more gate regions as just described. FIG. 11V depicts the substrate after forming an etch stop layer 668 and inter-layer dielectric 670.

Figure 12:
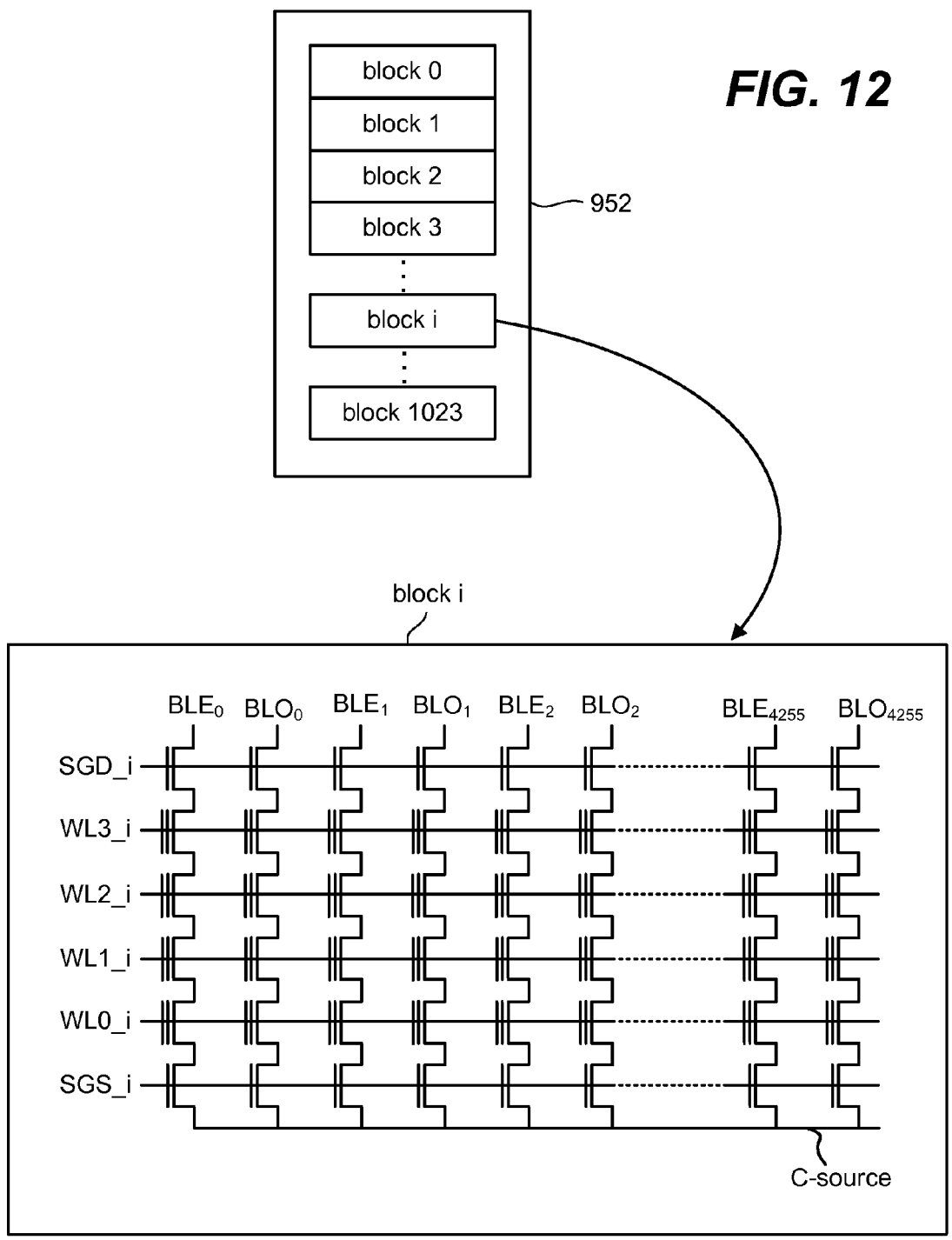
FIG. 12 depicts an exemplary organization of a memory array in accordance with one embodiment.

FIG. 12 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 12 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 13:
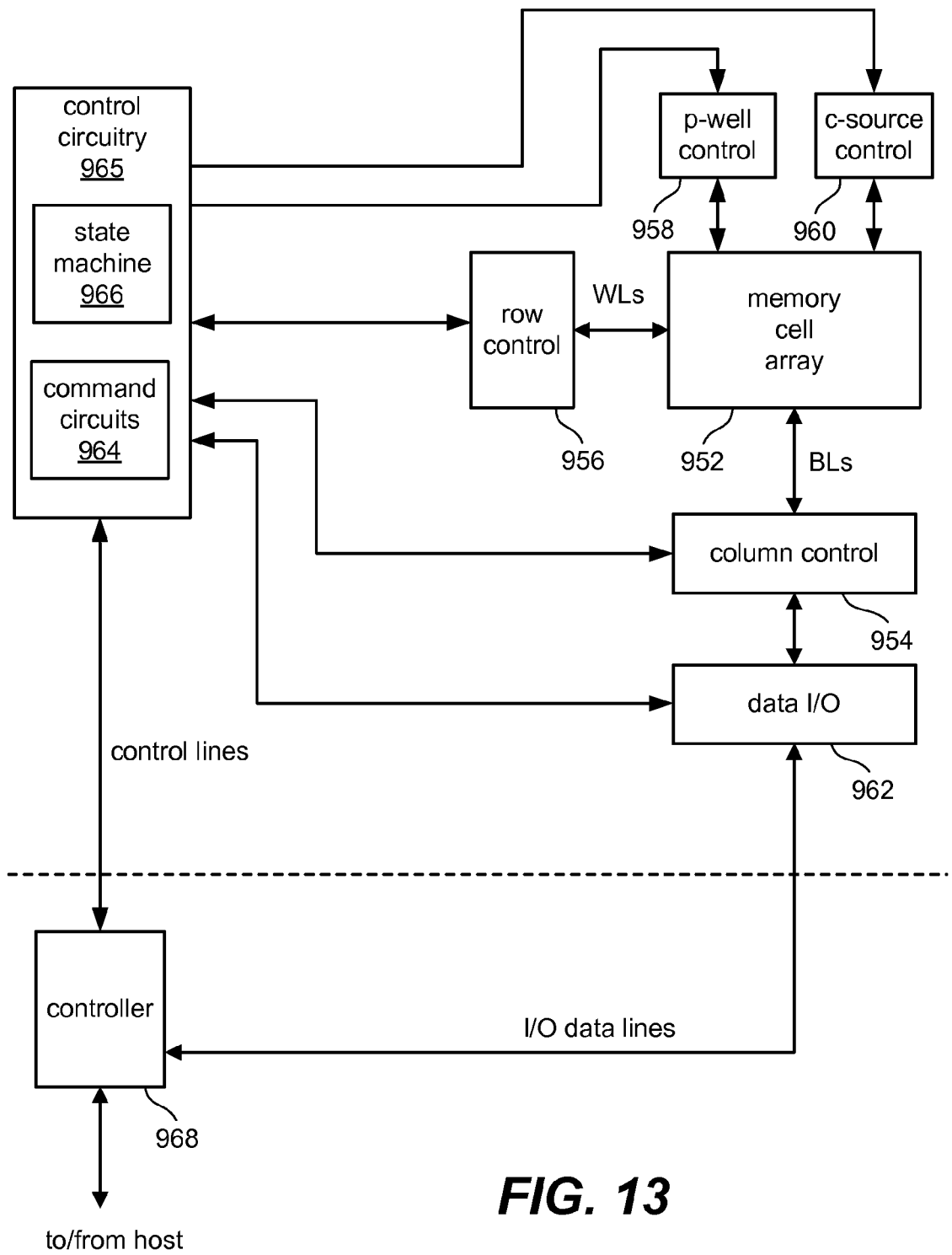
FIG. 13 is a block diagram of an exemplary memory system that can be used to implement embodiments of the disclosed technology.

FIG. 13 is a block diagram of one embodiment of a flash memory system that can be used to implement one or more embodiments of the present disclosure. Other systems and implementations can also be used. Memory cell array 952 is controlled by column control circuit 954, row control circuit 956, c-source control circuit 960 and p-well control circuit 958. Column control circuit 954 is connected to the bit lines of memory cell array 952 for reading data stored in the memory cells, for determining a state of the memory cells during a program operation, and for controlling potential levels of the bit lines to promote or inhibit programming and erasing. Row control circuit 956 is connected to the word lines to select one of the word lines, to apply read voltages, to apply program voltages combined with the bit line potential levels controlled by column control circuit 954, and to apply an erase voltage. C-source control circuit 960 controls a common source line connected to the memory cells. P-well control circuit 958 controls the p-well voltage.

The data stored in the memory cells are read out by the column control circuit 904 and are output to external I/O lines via data input/output buffer 962. Program data to be stored in the memory cells are input to the data input/output buffer 962 via the external I/O lines, and transferred to the column control circuit 954. The external I/O lines are connected to controller 968.

Command data for controlling the flash memory device is input to controller 968. The command data informs the flash memory of what operation is requested. The input command is transferred to state machine 966 which is part of control circuitry 965. State machine 966 controls column control circuit 954, row control circuit 956, c-source control 960, p-well control circuit 958 and data input/output buffer 962. State machine 966 can also output status data of the flash memory such as READY/BUSY or PASS/FAIL.

Controller 968 is connected to or connectable with a host system such as a personal computer, a digital camera, or personal digital assistant, etc. It communicates with the host that initiates commands, such as to store or read data to or from the memory array 952, and provides or receives such data. Controller 968 converts such commands into command signals that can be interpreted and executed by command circuits 964 which are part of control circuitry 965. Command circuits 964 are in communication with state machine 966. Controller 968 typically contains buffer memory for the user data being written to or read from the memory array.

One exemplary memory system comprises one integrated circuit that includes controller 968, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Various features and techniques are presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of making non-volatile memory, comprising:
    forming a first layer of charge storage material at a peripheral circuitry region of a substrate and a memory array region of the substrate;
    forming a second layer of charge storage material at the peripheral circuitry region and the memory array region;
    etching the first layer at the array region to form a first set of strips of charge storage material elongated in a first direction with spaces therebetween in a second direction substantially perpendicular to the first direction;
    etching the second layer at the array region to form a second set of strips of charge storage material elongated in the first direction with spaces therebetween in the second direction;
    forming a third set of strips of conductive material elongated in the first direction and at least partially occupying the spaces between adjacent strips of the second layer of charge storage material;
    etching the first set of strips, the second set of strips and the third set of strips along their lengths in the first direction thereby forming a set of first charge storage regions from each strip of the first set, a set of second charge storage regions from each strip of the second set and a set of control gates from each strip of the third set;
    etching the first layer of charge storage material and the second layer of charge storage material at the peripheral circuitry region to define a dimension of a gate region for a transistor after etching the sets of strips at the memory array region, the gate region including a portion of the first layer of charge storage material and a portion of the second layer of charge storage material.

2. The method of claim 1, wherein:
    the first layer of charge storage material is undoped polysilicon; and
    the second layer of charge storage material is doped polysilicon.

* * * * *